US011264983B1

(12) United States Patent
Kaya et al.

(10) Patent No.: US 11,264,983 B1
(45) Date of Patent: Mar. 1, 2022

(54) APPARATUS AND METHODS TO PARALLELIZE TRANSISTORS

(71) Applicant: Texas Instruments Incorporated, Dallas, TX (US)

(72) Inventors: Cetin Kaya, Plano, TX (US); Nathan Richard Schemm, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/087,262

(22) Filed: Nov. 2, 2020

(51) Int. Cl.
*H03K 17/16* (2006.01)
*H03K 17/30* (2006.01)
*H03K 17/284* (2006.01)

(52) U.S. Cl.
CPC ......... *H03K 17/167* (2013.01); *H03K 17/284* (2013.01); *H03K 17/302* (2013.01)

(58) Field of Classification Search
CPC .. H03K 17/165; H03K 17/166; H03K 17/167; H03K 17/28; H03K 17/284; H03K 17/302
See application file for complete search history.

(56) References Cited

U.S. PATENT DOCUMENTS

| 8,243,479 B2* | 8/2012 | Chen ................... H01L 23/64 363/39 |
| 10,637,432 B2* | 4/2020 | Kai .................... H03H 9/02992 |
| 2019/0326887 A1 | 10/2019 | Kaya et al. | |

OTHER PUBLICATIONS

U.S. Appl. No. 16/219,345, filed Dec. 13, 2018, 56 pages.

* cited by examiner

*Primary Examiner* — Hai L Nguyen
(74) *Attorney, Agent, or Firm* — Michael A. Davis, Jr.; Charles A. Brill; Frank D. Cimino

(57) ABSTRACT

Methods, apparatus, systems and articles of manufacture are described to parallelize transistors. An example apparatus includes a first transistor on a first die and a second transistor on a second die. The example apparatus includes a parallel feedback terminal coupled to the first die and the second die and a current sensor including a first contact and a second contact. The example apparatus includes a resistor coupled to the current sensor and at least one of the switched terminal or a ground terminal. The example apparatus includes an active drive controller including a first input coupled to the resistor, a second input coupled to the parallel feedback terminal, and an output coupled to the parallel feedback terminal. The example apparatus includes an edge delay controller adapted to be coupled to a gate driver and an error amplifier, and a control contact adapted to be coupled to the gate driver.

20 Claims, 21 Drawing Sheets

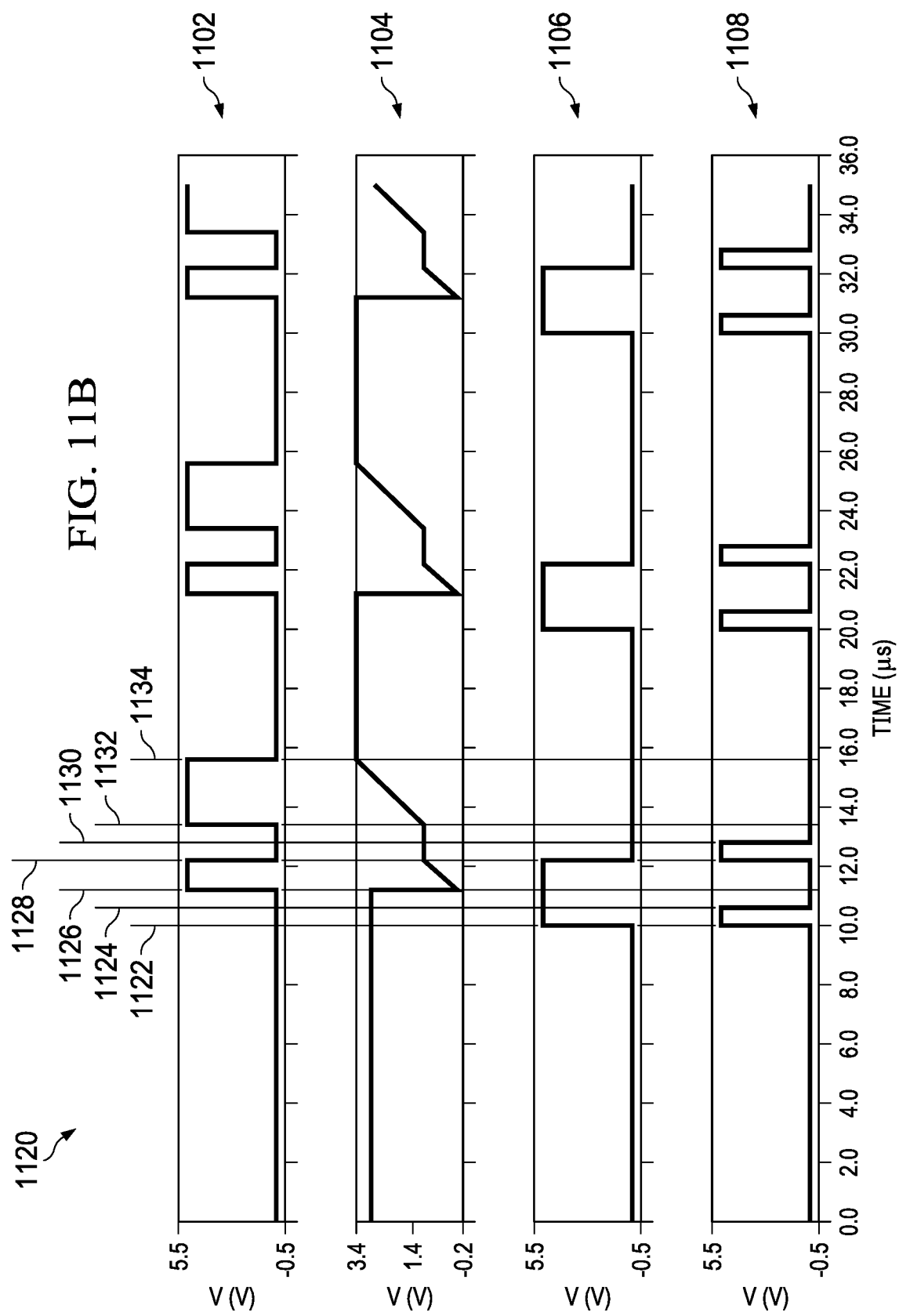

APPARATUS AND METHODS TO PARALLELIZE TRANSISTORS

TECHNICAL FIELD

This description relates generally to transistors, and more particularly to apparatus and methods to parallelize transistors.

BACKGROUND

In some devices, a transistor, such as a field-effect transistor (FET), is connected in parallel with another transistor. The parallel-coupled transistors may be controlled to provide current to a load, such as by pulse width modulation (PWM) signals at gates of the transistors.

SUMMARY

An example apparatus includes a first transistor on a first die, the first transistor including a first terminal, a second terminal and a control contact. The first terminal is coupled to a voltage bus terminal, and the second terminal is coupled to a switched terminal. The apparatus further includes a second transistor on a second die, the second transistor including a third terminal and a fourth terminal. The third terminal is coupled to the voltage bus terminal and the fourth terminal is coupled to the switched terminal. The apparatus further includes a parallel feedback terminal coupled to the first die and the second die. The apparatus further includes a current sensor including a first contact and a second contact. The first contact is coupled to the first terminal of the first transistor and the second contact is coupled to the second terminal of the first transistor. The apparatus includes a resistor coupled to the current sensor and at least one of the switched terminal or a ground terminal. The apparatus further includes an active drive controller including a first input coupled to the resistor, a second input coupled to the parallel feedback terminal, and an output coupled to the parallel feedback terminal. The apparatus further includes an edge delay controller adapted to be coupled to a gate driver and an error amplifier, and the control contact adapted to be coupled to the gate driver.

BRIEF DESCRIPTION OF THE DRAWINGS

FIGS. 11A-11B are example signal diagrams corresponding to example signals observed on the analog circuits of FIGS. 1-8.

DETAILED DESCRIPTION

Figure 1:
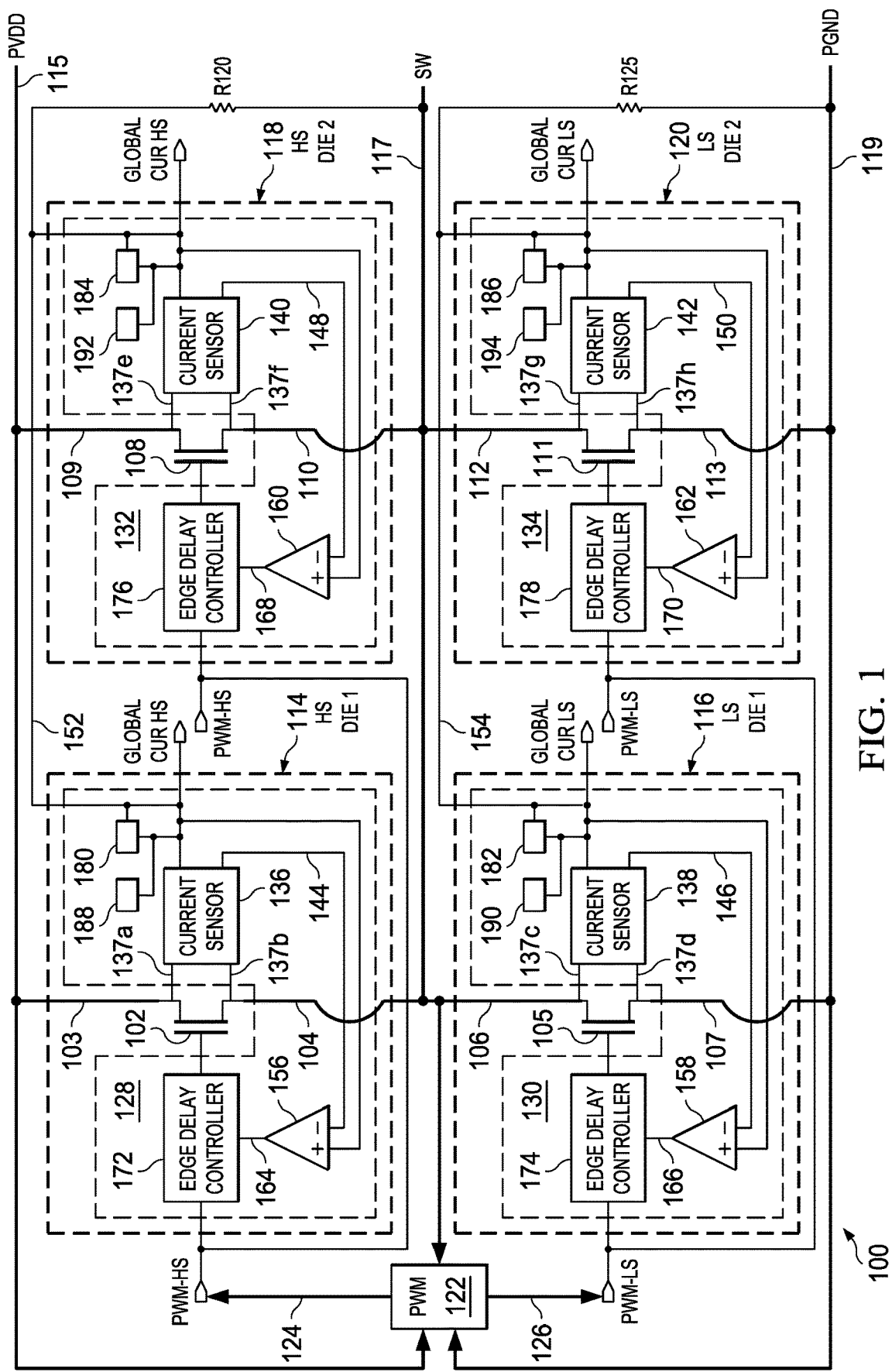
FIG. 1 is a schematic illustration an example analog circuit to implement parallelized transistors.

The drawings are not necessarily drawn to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Although the drawings show layers and regions with clean lines and boundaries, some or all of these lines and/or boundaries may be idealized. In reality, the boundaries and/or lines may be unobservable, blended, and/or irregular.

Power stages are used in various circuits, such as power conversion circuits, power factor correction circuits, discontinuous current mode power switching circuits, continuous current mode power switching circuits, adapters, or electric vehicle charging units. A technique to provide more power and/or more current in a power stage is to parallel-couple transistors. When parallel-coupled, transistors are connected to a common voltage source and load and are driven by a pulse width modulated (PWM) gate driver signal (e.g., PWM signal). Parallel-coupling transistors that receive the same PWM signal increases the ability of a power stage to source more output current, because the parallel-coupled transistors share the current load.

In some devices, parallel-coupled transistors that receive the same PWM signal turn on and/or off at precisely the same time. When parallel-coupled transistors turn on at exactly the same time, the load current is split equally across the parallel-coupled transistors, and the in-rush current is shared. However, in practice, even though the parallel-coupled transistors may be driven by the same PWM signal, each transistor may turn on at a slightly different time due to process variations. When parallel-coupled transistors are used, the first transistor of the parallel-coupled transistors to turn on in response to a PWM signal will experience a higher in-rush current than the other transistor(s). For example, the transistor that turns on first will, for a short period of time, conduct the total load current instead of splitting the load current across the other parallel-coupled transistor. As a result, high current values may be conducted through an inductor between a die and the ground while another die has not yet switched on, resulting in large voltage fluctuations (e.g., on the order of 10-20V) on a printed circuit board (PCB). These large voltage fluctuations are sometimes referred to as ground bounce. When the signal of interest is significantly smaller than the magnitude of the ground bounce signal generated due to unequal switching times, the ground bounce can cause excessive noise until it is eliminated. A single parallel-coupled transistor that conducts the total load current encounters high safe operating area (SOA) stress, so the transistor operates in conditions that stress the transistor and lead to faster degradation.

Example apparatus, methods, systems, and articles of manufacture (e.g., physical storage media) described herein enable communication of low-level signals of interest associated with switching of parallel transistors in a very noisy environment. Example techniques described herein actively drive (e.g., adjust) a voltage level on a parallel feedback pin between parallel transistors (on parallel dies) to reduce the amount of time required for the voltage through each transistor to settle. In some example apparatus, methods, systems, and articles of manufacture described herein, a resistor is coupled between parallel feedback pins. The parallel feedback pins are coupled between parallel transistors. Coupling a resistor between the parallel feedback pins limits current flow through electrostatic discharge (ESD) cells when voltage fluctuations occur due to parallel transistor switching. For example, without the resistor between the parallel feedback pins, large voltage differences could quickly build up between the two ground busses (the grounds connected to each die) and cause large current flows in between dies. Such a large voltage difference may result in exceeding the current limits of the ESD diodes that connect the separate ground busses. The resistor between the parallel feedback pins advantageously limits currents and damps voltage fluctuations, while still allowing each individual die to actively adjust a common voltage level between the transistors. As used herein, transistors may be any type of transistor, such as field effect transistors (FETs), metal-oxide-semiconductor field-effect transistors (MOSFETs), etc.

In some example apparatus, methods, systems, and articles of manufacture described herein, to speed up settling of voltage signals after a switching event on an analog circuit including parallelized transistors, voltages are adjusted on parallel feedback pins between the parallelized transistors based on peak current values observed on each of the transistors. With each parallel feedback pin adjusted based on the peak current experienced by its respective transistor, the overall current on the bus between the transistors becomes an average value and helps to reduce the settling time required to stabilize voltages on each of the dies.

In some example apparatus, methods, systems, and articles of manufacture described herein, to speed up settling of voltage signals after a switching event on an analog circuit including parallelized transistors, voltages are adjusted on parallel feedback pins based on one transistor being designated a leader (e.g., by satisfying a leader condition), while other parallel transistors (e.g., "followers") are adjusted based on the leader. In some examples, the leader is selected based on a leader condition, such as having a lowest or highest peak voltage value, peak switching current value, temperature, and/or other circuit characteristic. In some such examples, the leader may change throughout operation based on changes in performance of each of the parallel transistors. In some such examples, a follow-the-leader technique as described herein enables the elimination of a critical value resistor on an analog circuit, thereby reducing the need for resistor trimming and maintenance of a high precision temperature coefficient resistor.

Example apparatus, methods, systems, and articles of manufacture (e.g., physical storage media) described herein enable fault monitoring and communication between parallel transistors to prevent faults on one transistor from affecting the performance of another transistor. For example, example techniques described herein communicate an overvoltage, undervoltage, overtemperature, and/or other faults between parallel transistors to prevent shutdowns in one transistor resulting in overcurrent conditions in another. Example techniques herein disable parallelization of transistors in sync with each other in response to a fault state in one or more transistors in the parallel configuration.

Example apparatus, methods, systems, and articles of manufacture (e.g., physical storage media) described herein speed up the settling time of voltage signals after a switching event on a digital circuit including parallelized transistors. In some such examples, a first die including a first transistor is coupled to two parallel feedback pins, and a second die including a second transistor (in parallel with the first transistor) is coupled to two other parallel feedback pins. On one of each die's parallel feedback pins, the respective die communicates a PWM signal representative of its own peak characteristic (such as peak voltage, peak current, peak temperature, etc.) information, while on the second parallel feedback pin, the die accesses a PWM signal representative of the peak characteristic of the other transistor in parallel. In some examples, the digital bus has a continuous time filter to adjust a PWM edge time and reduce settling time following switching events. As used herein, a "switching event" refers to a time period during and following the switching of a transistor, until voltage and/or current values of the signal stabilize. For example, following the change of a signal on a control contact of a transistor (e.g., from high to low, or from low to high), a switching event begins, and concludes at the time when the voltage bounces (e.g., fluctuations) are settled (such as reduced by 90%, reduced by a specified voltage deviation per time value, etc.).

FIG. 1 is a schematic illustration an example analog circuit 100 to implement parallelized transistors as described herein. The analog circuit 100 includes transistors 102, 105, 108, and 111 in which the peak current passed by the transistors 102, 105, 108, and 111 is controlled. The transistors 102, 105, 108, and 111 each include two current terminals (103 and 104, 106 and 107, 109 and 110, 112 and 113) respectively. The transistors 102, 105, 108, and 111, may be formed on respective dies 114, 116, 118 and 120. The dies 114, 116, 118 and 120 can be thermally coupled to at least one heatsink.

In the example illustrated in FIG. 1, a pulse width modulation generator 122 (PWM generator 122) generates PWM signals 124 and 126 (e.g., PWM-HS and PWM-LS) for the parallel-coupled high-side transistors 102, 108 and the parallel-coupled low-side transistors 105, 111 respectively. The example parallelization controller 128 is coupled to the PWM generator 122 and the high-side transistor 102, and the example parallelization controller 132 is coupled to the PWM generator 122 and the high-side transistor 108. Likewise, the example parallelization controller 130 is coupled to the PWM generator 122 and the low-side transistor 105, and the example parallelization controller 134 is coupled to the PWM generator 122 and the low-side transistor 111. In the example of FIG. 1, the PWM generator 122 generates PWM signals 124 and 126 (e.g., PWM-HS and PWM-LS); however, the PWM generator 122 is not limited to generating the two PWM signals 124 and 126 (e.g., PWM-HS and PWM-LS). For example, four PWM signals can be generated for the four transistors (102, 105, 108, and 111), and therefore, a delay can be implemented for each transistor individually by the PWM generator 122

The transistors 102 and 108 form a pair of high-side transistors that are coupled in parallel. The transistors 105 and 111 form a pair of low-side transistors that are also coupled in parallel. The high-side transistors 102 and 108 are coupled between an example positive voltage bus PVDD 115 and the example switched circuit node SW 117, and the example low-side transistors 105 and 111 are coupled between the switched circuit node SW 117 and example local circuit ground PGND 119. As used herein, the local circuit ground PGND 119 and the positive voltage bus PVDD 115 are sometimes referred to as voltage bus nodes. As used herein, the local circuit ground PGND 119 is sometimes referred to as a ground node. Thus, a transistor is connected to a voltage bus node (e.g., the positive voltage bus PVDD 115 if it is a high-side transistor, the local circuit ground PGND 119 if it is a low side transistor) and the switched circuit node SW 117. In some examples used herein, the switched circuit node SW 117 is referred to as a switched node. The high-side and low-side transistors (102, 105, 108, and 111) may include gallium nitride (GaN) layers formed epitaxially on a silicon substrate. Electrons in a GaN channel (e.g., 2DEG channel) move more quickly than electrons in a silicon (Si) channel (e.g., inversion channel), and thus, a GaN transistor (e.g., high electron mobility transistor (HEMT)) turns on and/or off faster than a Si transistor in response to a PWM signal. Also, transistors produced with a GaN layer include a lower capacitance between the drain and source terminals than transistors produced with Si. As a result, in response to a GaN transistor (e.g., high electron mobility transistor (HEMT)) being subjected to hard switching, the time during which the amplitude of the drain to source voltage is high and the amplitude of the drain current is high (e.g., the amplitude of the drain to source voltage overlaps with the amplitude of the drain current) is reduced. The reduction of time in which the amplitude of the drain to source voltage is high and the amplitude of the drain current is high allows the GaN transistor (e.g., high electron mobility transistor (HEMT)) to operate safely during hard switching and lowers power dissipation in transistors. In some examples described herein, the transistors 102, 105, 108, and 111 may be produced using a Si substrate, or any other transistor substrate.

In examples described herein, the current terminals 103 and 104 (e.g., source and drain terminals) of the high-side transistor 102 can each be coupled (e.g., connected) to the respective current terminals 109 and 110 of the high-side transistor 108 without intervening passive components (e.g., inductors, capacitors) coupled therebetween. The current terminals 103, 104, 109, and 110 of the example high-side transistors 102 and 108, respectively, are coupled in parallel such that larger amounts of power and/or current are switchable than otherwise possible when switched by only one example high-side transistor.

Likewise, in some examples described herein, the current terminals 106 and 107 (e.g., source and drain terminals) of the low-side transistor 105 can each be coupled (e.g., connected) to the respective current terminals 112 and 113 of the low-side transistor 111 without intervening passive components (e.g., inductors, capacitors) coupled therebetween. The current terminals 106, 107, 112, 113 of the example low-side transistors 105 and 111, respectively, are coupled in parallel such that larger amounts of power and/or current are switchable than otherwise possible when switched by only one example low-side transistor.

Although the example high-side and low-side transistors (102, 105, 108 and 111) are respectively coupled as pairs, each of the example high-side and low-side transistors (102, 105, 108 and 111) may be individually controlled in response to a peak current associated with an individual transistor. For example, if the high-side transistor 102 conducts a greater initial peak current than the high-side transistor 108, the high-side transistor 102 can be switched in response to the local initial peak current of the high-side transistor 108. Similarly, if the high-side transistor 108 conducts a greater initial peak current than the high-side transistor 102, the high-side transistor 108 can be switched in response to the local initial peak current of the high-side. Likewise, if the low-side transistor 105 conducts a greater initial peak current than the low-side transistor 111, the low-side transistor 105 can be switched in response to the local peak current of the low-side transistor 111. If the low-side transistor 111 conducts a greater initial peak current than the low-side transistor 105, the low-side transistor 111 can be switched in response to the local peak current of the low-side transistor 105.

An example PWM generator 122 is arranged to generate the example pulse width modulated high-side signal 124 for controlling the example high-side transistors 102 and 108 in response to the example circuit node SW 117. The example PWM generator 122 can alternatively be arranged to control the example high-side transistors 102 and 108 (and/or the low-side transistors 105 and 111) in response to a system operating parameter, such as an output voltage of a resistive, inductive, or capacitive load powered by the analog circuit 100. The example PWM generator 122 is arranged to generate the example pulse width modulated low-side signal 126 for controlling the example low-side transistors 105 and 111 in response to the example circuit node SW 117. The example PWM generator 122 can be powered by the example power rails PVDD 115 and PGND 119. In various examples, the PWM generator 122 can be a processor, such as a microcontroller or a digital signal processor (DSP).

An example pulse-width modulated high-side signal 124 (e.g., PWM-HS) is coupled to a first parallelization controller 128 and a second parallelization controller 132. The example pulse-width modulated low-side signal 126 (e.g., PWM-LS) is coupled to a third parallelization controller 130 and a fourth parallelization controller 134.

The example parallelization controllers (e.g., one of 128, 130, 132, and 134) each include an example current sensor (e.g., 136, 138, 140, and 142, respectively), an example error amplifier (e.g., 156, 158, 160, and 162, respectively), an example edge delay controller (e.g., 172, 174, 176, and 178, respectively), an example active drive controller (e.g., 180, 182, 184, and 186, respectively), and an example fault monitoring system (e.g., 188, 190, 192, and 194, respectively). The parallelization controllers (e.g., one of 128, 130, 132, and 134) can be included on the same die (e.g., 114, 116, 118, and 120, respectively) of the high-side or low-side transistor being controlled (e.g., 102, 105, 108, and 111, respectively). Alternatively, the parallelization controllers (e.g., one of 128, 130, 132, and 134) can be included on a separate die (e.g., 114, 116, 118, and 120, respectively) of the high-side or low-side transistor being controlled (e.g., 102, 105, 108, and 111, respectively).

Example current sensors 136, 138, 140, and 142 are coupled respectively to the example high-side and low-side transistors (102, 105, 108 and 111). The example current sensors 136, 138, 140, and 142 can be arranged on a multi-chip module adjacent to a component (e.g., chip including a high-side or low-side transistor to be monitored) mounted on the multi-chip module. The example current sensors can be located virtually anywhere on a die or a multi-chip module where the current sensors are coupled to an example respective metal-oxide-semiconductor field-effect-transistor. The current sensors 136, 138, 140, 142 include example contacts 137a, 137b, 137c, 137d, 137e, 137f, 137g, 137h. For example, the current sensor 136 includes an example first contact 137a coupled to the current terminal 103, and an example second contact 137b coupled to the current terminal 104.

In one example, the current sensors 136, 138, 140, and 142 are arranged on the same die(s) upon which each respective high-side and low-side transistor (102, 105, 108, and 111) is arranged. In another example, the current sensors 136, 138, 140, and 142 may be arranged on a multi-chip module upon which each respective high-side and low-side transistor (102, 105, 108, and 111) is carried. The example current sensors 136, 138, 140, and 142 are coupled to respective example high-side and low-side transistors (102, 105, 108 and 111). For example, the current sensors 136, 138, 140, and 142 may be coupled to the respective high-side and low-side transistors (102, 105, 108, and 111) by being arranged on the same die (e.g., 114, 116, 118, 120).

The example current sensors 136, 138, 140, and 142 are arranged (e.g., placed) to generate respective local sensed transistor peak currents 144, 146, 148, and 150, such that each signal indicates a sensed transistor peak current for a respective example high-side and low-side transistor (102, 105, 108, 111). Also, each signal which indicates a sensed transistor peak current 144, 146, 148, 150 may also be a voltage signal. The sensed transistor peak current 144, 146, 148, 150 are coupled to inverting input terminals of an example error amplifier 156, 158, 160, 162. In some examples, the error amplifiers 156, 158, 160, 162 are operational amplifiers. An example of shared global peak current signal 152, 154 is generated for each of the high-side and low-side circuits respectively, such that a global current signal 152, 154 is generated in response to current indications of at least two transistors of each of the high and low sides. In some examples described herein, each respective global current signal 152, 154 is a signal representative of a respective average peak current (e.g., the global current high-side 152 represents an average peak current of the sensed transistor peak currents 144 and 148).

Each respective global current signal 152, 154 is coupled to a non-inverting input terminal of an example error amplifier 156, 158, 160, 162. For example, a global current high-side (GLOBAL CUR HS) signal 152 is coupled to error amplifiers 156 and 160, and a global current low-side (GLOBAL CUR LS) signal 154 is coupled to operational amplifiers 158 and 162. Also, each signal which indicates a global current signal (152 or 154) may also be a voltage signal. Alternatively, the example global current signal (152 or 154) may be coupled to an inverting input terminal of an error amplifier 156, 158, 160, 162. Likewise, the example local current signal (144, 146, 148, and 150) may be coupled to a non-inverting input terminal of an error amplifier 156, 158, 160, and 162, respectively.

Each of the example error amplifiers 156, 158, 160, and 162 is arranged to generate a respective local current delta reference signal 164, 166, 168, and 170 in response to the respective global current signal 152 and 154 and the local current signal 144, 146, 148, and 150. Each respective local current delta reference signal 164, 166, 168, and 170 is coupled to a respective input terminal of the edge delay controllers 172, 174, 176, and 178.

The example edge delay controllers 172, 174, 176, and 178 may be analog circuits in which each example edge delay controller can delay a respective pulse-width modulated signal (124 or 126) in response to a respective local current delta reference signal 164, 166, 168, and 170. The edge delay controllers 172, 174, 176, and 178 may also be implemented by one or more strings of digital delay blocks controlled digitally.

The first edge delay controller 172 and the second edge delay controller 176 generate respective delayed PWM signals that are coupled to respective gate (e.g., control) terminals of the high-side transistors 102 and 108. A pulse-width modulated low-side (PWM-LS) signal 126 is coupled to a third edge delay controller 174 and a fourth edge delay controller 178. The third edge delay controller 174 and the fourth edge delay controller 178 generate respective delayed PWM signals that are coupled to respective gate terminals of the low-side transistors 105 and 111.

The example high-side transistors 102 and 108 are activated (e.g., by establishing a conduction channel) in response to the assertion of the example pulse-width modulated high-side signal 124. At least one of the example transistors 102 and 108 is also activated in response to a respective example edge delay controller 172, 176. The example low-side transistors 105 and 111 are activated in a similar manner, albeit in response to the low-side pulse-width modulated low-side signal 126 and arrangements.

The example active drive controllers 180, 182, 184, 186 of the illustrated example of FIG. 1 respectively adjust global currents between the parallelized transistors in order to reduce the amount of time required for the voltage to settle during switching of the transistors. For example, the active drive controller 180 can adjust a voltage level associated with the global peak current 152 shared between the transistors 102, 108. The active drive controller 180 can be activated in response to a switching event (e.g., a change in the PWM signal 124). Similarly, the active drive controllers 182, 184, 186 can be activated in response to switching events (e.g., changes in their respective PWM signal 124, 126) to reduce settling time of voltage fluctuations on respective transistors 105, 108, 111. Further detail of the structure and operation of the active drive controllers 180, 182, 184, 186 is illustrated and described in connection with FIGS. 2-8 and FIG. 10.

The example fault monitoring systems 188, 190, 192, 194 of the illustrated example of FIG. 1 identify and/or communicate fault conditions on their respective dies 114, 116, 118, 120. In some examples, fault monitoring system 188, 190, 192, 194 detect conditions such as overvoltage, undervoltage, overcurrent, undercurrent, excessive temperature, and/or any other potentially problematic conditions in their respective dies 114, 116, 118, 120. In some such examples, the fault monitoring systems 188, 190, 192, 194 communicate any faults to any other ones of the dies 114, 116, 118, 120 which are in parallel with the die which detected the fault. The fault monitoring systems 188, 190, 192, 194 enable the dies 114, 116, 118, 120 to react in coordination to faults. For example, if a fault is detected on the die 114, the fault monitoring system 188 can communicate the fault to the die 118, thus enabling coordinated action to correct the fault (such as ending parallelization of the dies 114, 118, turning off or connecting the transistors 102, 108 to a high impedance (HiZ) at the same time, etc.). Further detail of the structure and operation of the fault monitoring systems 188, 190, 192, 194 is illustrated and described in connection with FIGS. 9 and 11.

Figure 2:
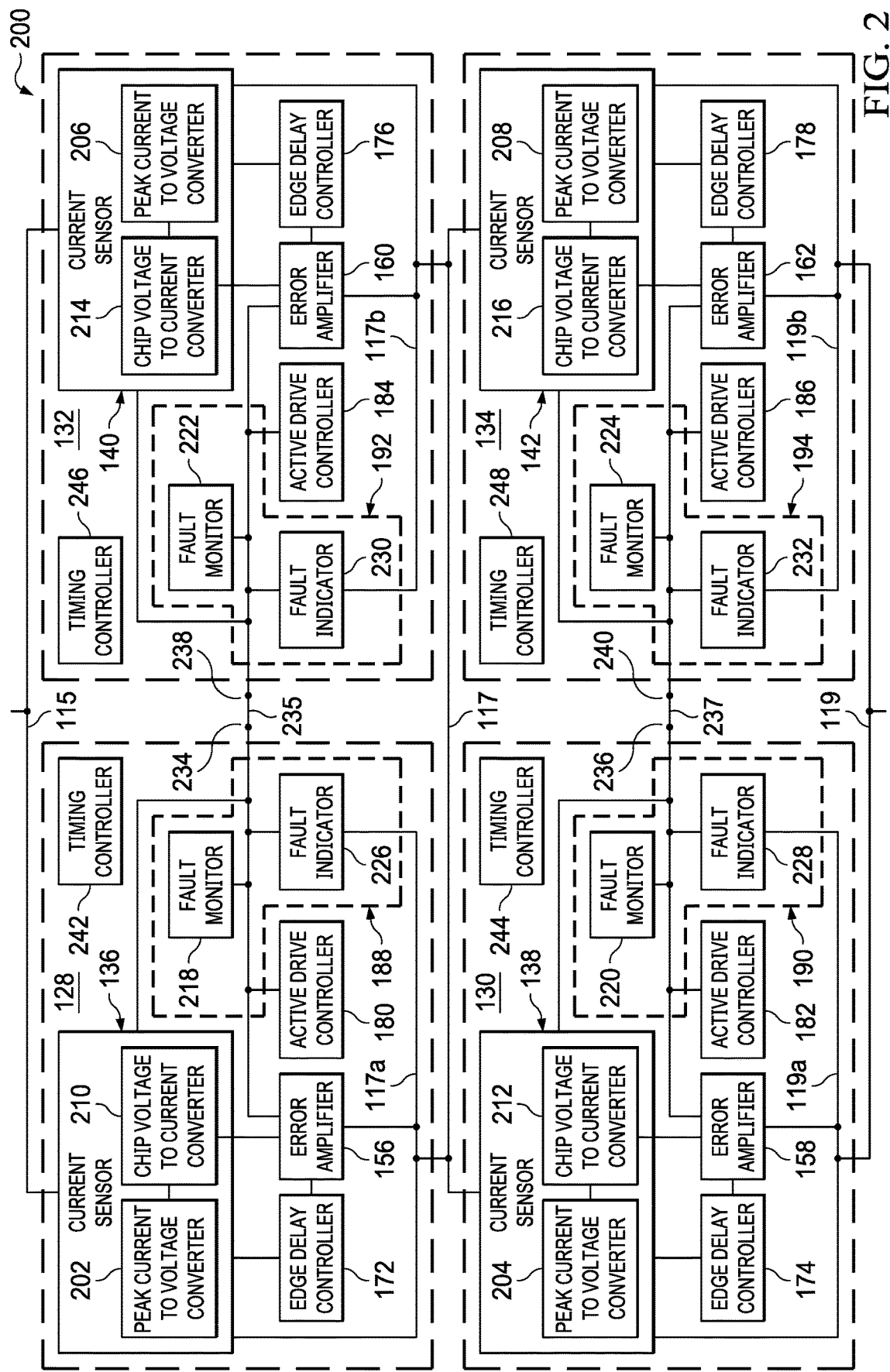
FIG. 2 is a block diagram illustrating an example implementation of the parallelization controllers of the analog circuit of FIG. 1.

FIG. 2 is a block diagram 200 illustrating an example implementation of the parallelization controllers 128, 130, 132, 134 of the analog circuit 100 of FIG. 1. For visual clarity, the dies 114, 116, 118, 120 are not illustrated in FIG. 2, but the parallelization controllers 128, 130, 132, 134 correspond to the respective dies 114, 116, 118, 120 of FIG. 1. The block diagram 200 of the illustrated example of FIG. 2 includes the parallelization controllers 128, 130, 132, 134, the positive voltage bus PVDD 115, the switched circuit node SW 117, the local circuit ground PGND 119, the current sensors 136, 138, 140, 142, the error amplifiers 156, 158, 160, 162, the edge delay controllers 172, 174, 176, 178, the active drive controllers 180, 182, 184, 186, and the fault monitoring systems 188, 190, 192, 194 of the analog circuit 100 of FIG. 1. In the block diagram 200 of FIG. 2, the example current sensors 136, 138, 140, 142 include example peak current to voltage converters 202, 204, 206, 208, and example chip voltage to current converters 210, 212, 214, 216. Further, in the block diagram 200 of FIG. 2, the example fault monitoring systems 188, 190, 192, 194 include example fault monitors 218, 220, 222, 224 and example fault indicators 226, 228, 230, 232. Also, the block diagram 200 of FIG. 2 includes example parallel feedback pins 234, 236, 238, 240, example parallel feedback nodes 235, 237, and example timing controllers 242, 244, 246, 248.

As illustrated in FIG. 2, the die 114 includes a first local switched circuit node 117a, and the die 118 includes a second local switched circuit node 117b. The first local switched circuit node 117a and the second local switched circuit node 117b are coupled to the switched circuit node SW 117. Similarly, the die 116 includes a first local circuit ground 119a and the die 120 includes a second local circuit ground 119b. The first local circuit ground 199a and the second local circuit ground 199b are coupled to the local circuit ground PGND 119.

For brevity, the discussion in FIG. 2 focuses on the parallelization controller 128 on the die 114. However, any functionality and/or characteristics attributed to the parallelization controller 128 and/or any component on the parallelization controller 128 (e.g., the current sensor 136, the error amplifier 156, the edge delay controller 172, the active drive controller 180, the fault monitoring system 188, the peak current to voltage converter 202, the chip voltage to current converter 210, the fault monitor 218, and/or the fault indicator 226) apply equally to the parallelization controller 128, 130, 132, 134 and/or any of the respective components of the parallelization controller 128, 130, 132, 134.

The example peak current to voltage converter 202 of the illustrated example of FIG. 2 determines a peak current value corresponding to a current through the transistor associated with the die 114. For example, the peak current to voltage converter 202 can determine a peak current value observed through the transistor for a specified period (e.g., a sampling period). In some examples, the peak current to voltage converter 202 includes one or more capacitors and/or one or more operational amplifiers. Further detail and description of the peak current to voltage converter 202 is illustrated and described in the example of FIG. 3.

The example chip voltage to current converter 210 of the illustrated example of FIG. 2 converts the voltage value from the peak current to voltage converter 202 to a current value that can be provided to the example parallel feedback pin 234 and the error amplifier 156. For example, the chip voltage to current converter 210 can provide a current value (e.g., converted to voltage through a resistor) to the error amplifier 156 for comparison with a voltage on the parallel feedback pin 234, thereby enabling calculation of an error value representative of the peak current through the transistor on the die 114 to current and/or voltage values on the parallel feedback pins 234, 238 connecting the dies 114, 118. In some examples, the chip voltage to current converter 210 includes one or more resistors which convert the voltage output by the peak current to voltage converter 202 to a representative current value. By using the combination of the peak current to voltage converter 202 and the chip voltage to current converter 210, the current sensor 136 enables other parallel dies (e.g., the die 114) to have access to information corresponding to the peak current across the transistor on the die 114, and thereby make adjustments (such as adjusting the pulse width edge timing, adjusting the voltage on the parallel feedback pins 234, 238, etc.) to improve parallel performance (such as equalize peak switching currents through transistors, reduce voltage offsets, reduce voltage ringing after switching events, etc.).

The example fault monitor 218 of the illustrated example of FIG. 2 determines whether a fault condition exists on any other parallel die (e.g., the die 118). In some examples, the fault monitor 218 determines whether a fault condition exists on a parallel die based on a voltage level at the parallel feedback pin 234. In some examples, the fault monitor 218 measures a change in voltage on the parallel feedback pin 234 with respect to time, and determines that a fault condition exists on a parallel die based on the change in voltage on the parallel feedback pin 234 with respect to time exceeding a threshold voltage change rate. In some examples, the fault monitor 218 communicates with a logic block on the die 114 to cause parallelization between the dies 114, 118 to be disconnected and/or adjusted in response to a fault condition being detected.

The example fault indicator 226 of the illustrated example of FIG. 2 detects fault conditions on the die 114. For example, the fault indicator 226 can detect if a voltage on the die 114 exceeds a maximum voltage threshold or fails to satisfy a minimum voltage threshold. Similarly, the fault indicator 226 can detect if a current value on the die 114 exceeds a maximum current threshold. In some examples, the fault indicator 226 can detect a condition where a temperature on the die 114 exceeds a threshold. In some examples, the fault indicator 226 can detect a condition where a frequency value of a signal on the die 114 exceeds a threshold. In response to different faults, the fault indicator 226 can intelligently adjust voltage levels on the on the parallel feedback pin 234. For example, in response to detecting that the frequency of a signal on the die 114 is too high, the fault indicator 226 can close a switch (such as a transistor, a solid state switch, etc.) to directly connect the parallel feedback pin 234 to a voltage (such as 5V, 10V, etc.) above the switched circuit node SW 117. In some examples, in response to detecting a fault condition on the die 114, the fault indicator 226 can close a switch (such as a transistor, a solid state switch, etc.) and connect the parallel feedback pin 234 to the switched circuit node SW 117 to cause the voltage on the die 114 to change to a low value (such as a ground value, 0V, etc.). Further detail of the fault monitor 218 and the fault indicator 226 is illustrated and described in FIG. 8.

The example parallel feedback pin 234 of the illustrated example of FIG. 2 is a pin that is coupled to an example parallel feedback node 235 bus connecting the parallel dies 114, 118. The parallel feedback node 235 of the illustrated example of FIG. 2 is coupled to the dies 114, 118. The parallel feedback node 237 of the illustrated example of FIG. 2 is coupled to the dies 116, 120. The parallel feedback node 235 is coupled to the parallel feedback pins 234, 238, while the parallel feedback node 237 is coupled to the parallel feedback pins 236, 240. The parallel feedback pin 234 provides the die 114 insight into voltage levels on the parallel die 118, because it is on a bus that connects the dies 114, 118. In some examples, the parallel feedback pin 234 is implemented on the die 114. Further detail of the parallel feedback pin 234 is illustrated and described in FIGS. 3-9.

The example timing controller 242 of the illustrated example of FIG. 2 controls sampling times, blanking times, and/or timing windows on the parallelization controller 128. The sampling period is the time during which the edge delay controller 174 can actively adjust timing of the PWM pulse transmitted to the transistor synchronize switching times. The blanking period is a time when sampling is prevented, to allow time for voltage fluctuations caused by switching to settle. For example, the blanking period may be associated with a time during which the active drive controller 180 attempts to eliminate voltage ringing on the die 114 and/or on the parallel feedback node 235. The timing controller 242 of FIG. 2 may be implemented by one or more timers, and/or by control logic to cause other components of the parallelization controller 128 to adopt certain behaviors during specified time periods (such as preventing the edge delay controller 172 from sampling during the blanking period, causing the active drive controller 180 to drive a voltage for a specified amount of time, etc.).

While an example manner of implementing the parallelization controllers 128, 130, 132, 134 of FIG. 1 is illustrated in FIG. 2, one or more of the elements, processes and/or devices illustrated in FIG. 2 may be combined, divided, rearranged, omitted, eliminated and/or implemented in any other way. Further, the example current sensors 136, 138, 140, 142, the example error amplifiers 156, 158, 160, 162, the example edge delay controllers 172, 174, 176, 178, the example active drive controllers 180, 182, 184, 186, the example fault monitoring systems 188, 190, 192, 194, the example peak current to voltage converters 202, 204, 206, 208, the example chip voltage to current converters 210, 212, 214, 216, the example fault monitors 218, 220, 222, 224, the example fault indicators 226, 228, 230, 232 and/or, more generally, the example parallelization controllers 128, 130, 132, 134 of FIG. 2 may be implemented by hardware, software, firmware and/or any combination of hardware, software and/or firmware. Thus, for example, any of the example current sensors 136, 138, 140, 142, the example error amplifiers 156, 158, 160, 162, the example edge delay controllers 172, 174, 176, 178, the example active drive controllers 180, 182, 184, 186, the example fault monitoring systems 188, 190, 192, 194, the example peak current to voltage converters 202, 204, 206, 208, the example chip voltage to current converters 210, 212, 214, 216, the example fault monitors 218, 220, 222, 224, the example fault indicators 226, 228, 230, 232 and/or, more generally, the example parallelization controllers 128, 130, 132, 134 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). At least one of the example current sensors 136, 138, 140, 142, the example error amplifiers 156, 158, 160, 162, the example edge delay controllers 172, 174, 176, 178, the example active drive controllers 180, 182, 184, 186, the example fault monitoring systems 188, 190, 192, 194, the example peak current to voltage converters 202, 204, 206, 208, the example chip voltage to current converters 210, 212, 214, 216, the example fault monitors 218, 220, 222, 224, the example fault indicators 226, 228, 230, 232 and/or, more generally, the example parallelization controllers 128, 130, 132, 134 of FIG. 2 is/are hereby expressly defined to include a non-transitory computer readable storage device or storage disk, such as a memory, a digital versatile disk (DVD), a compact disk (CD), a Blu-ray disk, etc. including the software and/or firmware. Further still, the example parallelization controllers 128, 130, 132, 134 of FIG. 2 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
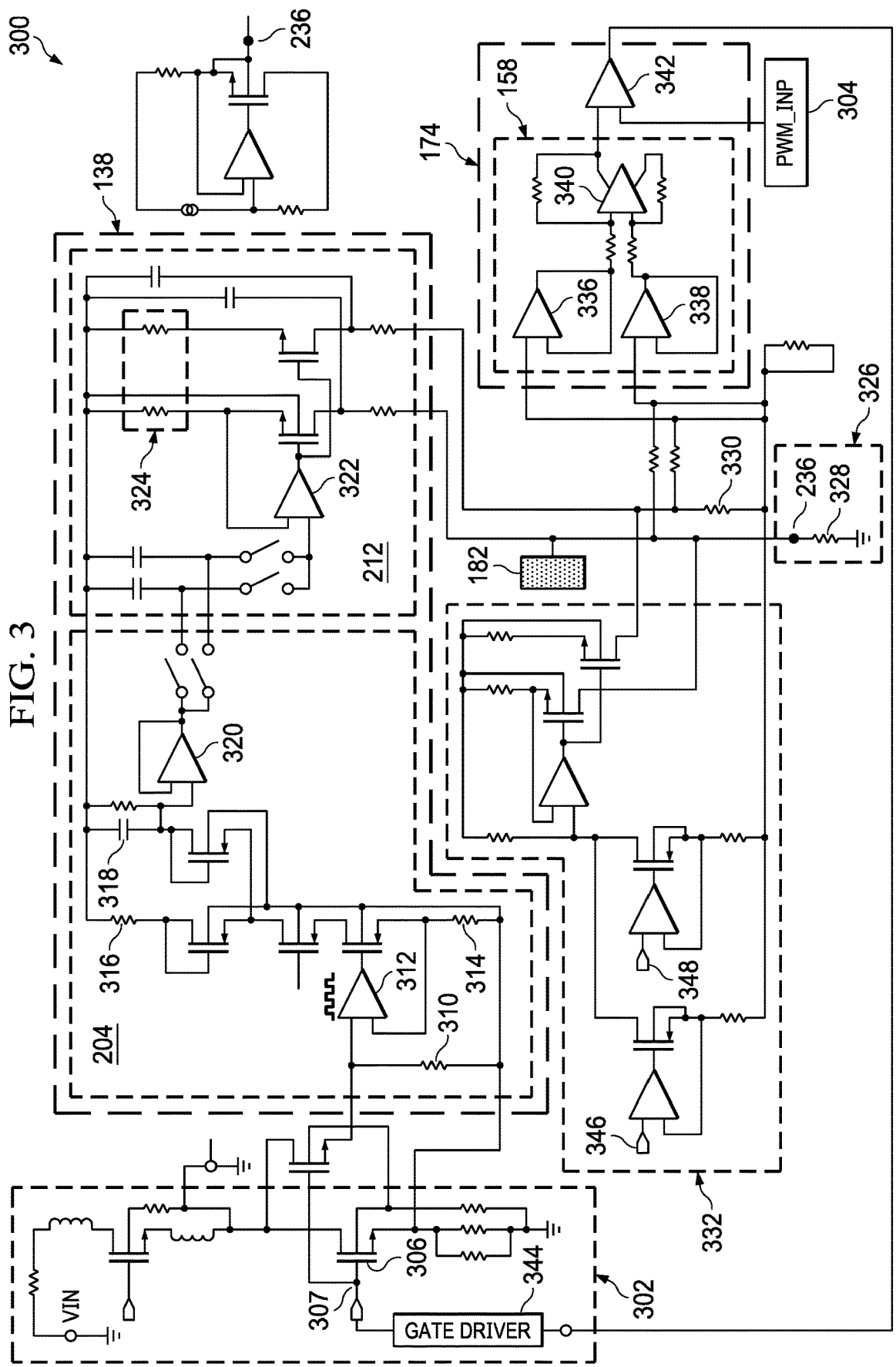
FIG. 3 is an illustration of an example analog circuit to implement the example active drive controller of FIG. 2.

FIG. 3 is an illustration of an example analog circuit 300 to implement an example average current implementation of the example active drive controller 182 of FIG. 2. In this example implementation, the turn on and/or off time for an example low side transistor 306 is adjusted. The low side transistor 306 includes an example control contact 307. The example low side transistor 306 can be a representation of the transistor 105 on the die 116 of FIG. 1. While the illustration of the analog circuit 300 of FIG. 3 focuses on detail of the low-side transistor 306, the description and illustration applies equally to other low-side transistors (e.g., the transistor 111 of FIG. 1), as well as high-side transistors (e.g., the transistors 102, 108 of FIG. 1). Accordingly, FIG. 3 depicts the parallelization controller 130 coupled to an example power conversion circuit 302 and an example averager 326. In some examples, the power conversion circuit 302 and/or the averager 326 may be part of (such as integral to, included in, etc.) the parallelization controller 130. In this example, the parallelization controller 130 includes the current sensor 138, the temperature sensor 332, and the edge delay controller 174. In other examples described herein, the order in which the current sensor 138, the temperature sensor 332, the edge delay controller 174, the averager 326, and the power conversion circuit 302 interact may be rearranged. When multiple transistors are coupled in parallel, an additional replica parallelization controller (e.g., the parallelization controller 134 of FIG. 1) exists for all parallel-coupled transistors. The averager 326 is coupled to all existing parallelization controllers (e.g., 130, 134).

The example power conversion circuit 302 may be any circuit used for a power stage. For example, a buck converter has transistors to convert a high direct current (DC) input voltage to a low DC output voltage. In other examples, the power conversion circuit 302 can be adopted into power stages such as automobile applications, personal electronic devices, integrated chips, etc. Also, other examples described herein include power conversion circuits for GaN power stages (e.g., a power stage including a GaN transistor).

The example PWM generator 304 generates a PWM signal (e.g., turn on and/or off signal) for the low side transistor 306. Example implementations of the PWM generator 304 include using an integrated circuit such as a timing chip, comparators, etc. Regardless of implementation, the PWM generator 304 is coupled to a parallelization controller (e.g., 130, 134) for each individual parallel-coupled transistor. The parallelization controllers (e.g., 130, 134) provide an individual adjusted PWM signal for each parallel-coupled transistor.

The example low-side transistor 306 is a three terminal switching device (e.g., HEMT). Examples described herein include a low-side transistor 306 produced from a Gallium Nitride (GaN) substrate. Examples described herein include a GaN transistor used in power stage applications. Further example power stage applications include power factor correction circuits, discontinuous current mode power switching circuits, continuous current mode power switching circuits, adapters, electric vehicle charging units, etc. Also, examples described herein include parallel-coupled GaN transistors. Other examples include a low-side transistor 306 and/or parallel coupled transistors produced using another substrate such as Silicon (Si), Silicon Carbide (SiC), or any other substrate.

In some examples, the peak current to voltage converter 204 includes an example first trimmed resistor 310, an example amplifier 312, an example resistor 314, an example amplification resistor 316, an example capturing capacitor 318, and an example voltage buffer 320.

The example current sensor 138 includes a first trimmed resistor 310. The first trimmed resistor 310 aids in the measurement of current by creating a voltage drop. The voltage drop created is proportional to the current seen by the low-side transistor 306. For example, when a peak current from the low-side transistor 306 travels through the first trimmed resistor 310, a voltage drop across the first trimmed resistor 310 is created. The peak voltage measured across the voltage drop is proportional to the peak current through the low-side transistor 306. The example current measured via the example first trimmed resistor 310 represents the current flowing through the low side transistor 306 in a manner that is proportional in magnitude (e.g., may be degrees of magnitude greater than or less than the actual peak current flowing through the transistor).

The example amplifier 312 is a low offset voltage, high bandwidth amplifier which amplifies the voltage over the first trimmed resistor 310. Alternatively, the amplifier 312 may be any device which outputs a value proportional to the input. Due to the amplifier 312, the voltage captured over the first trimmed resistor 310 is forced on the resistor 314. The first trimmed resistor 310 is coupled with the positive terminal of the amplifier 312 and the resistor 314 is coupled with the negative terminal of the amplifier 312. In other examples, the first trimmed resistor 310 may be coupled to the negative terminal of the amplifier 312 and/or the resistor 314 may be coupled to the positive terminal of the amplifier 312.

The example resistor 314 is coupled to an amplification resistor 316. The voltage over the resistor 314 may be increased and/or decreased across a voltage drop over the amplification resistor 316. The amplification resistor 316 is coupled to the example voltage capturing capacitor 318. For example, the peak current flowing through the first trimmed resistor 310 is transferred as a peak voltage over the resistor 314 due to a voltage drop. The amplification resistor 316 creates a proportional peak voltage to be captured by the voltage capturing capacitor 318.

The example voltage capturing capacitor 318 is coupled to a series of example voltage buffers 320, 322. Other examples have only one voltage buffer 320 or 322 coupled to the voltage capturing capacitor 318, or multiple voltage buffers 320, 322 coupled to the voltage capturing capacitor 318.

The example voltage buffers 320, 322 ensure the peak voltage value from the voltage capturing capacitor 318 is transferred across the capturing trimmed resistors 324. In the illustrated example of FIG. 3, the voltage buffer 322 and the capturing trimmed resistor 324 are included in the chip voltage to current converter 212.

In some examples, the example chip voltage to current converter 210 includes the example voltage buffer 322 and example capturing trimmed resistors 324.

The capturing trimmed resistors 324 are coupled to the parallel feedback pin 236 and an example second trimmed resistor 330. In some examples described herein, the second trimmed resistor 330 includes a resistance equal to the capturing trimmed resistors 324. Likewise, the parallel feedback pin 236 includes resistors which are equivalent in resistance to the resistance of the second trimmed resistor 330. The parallel feedback pin 236 is coupled with the averager 326. An equivalent number of trimmed resistors for the total number of parallel coupled transistors is coupled to the parallel feedback pin 236. For example, for three transistors coupled in parallel, three resistors may be coupled to the same external parallel feedback pin 236. Alternatively, a single resistor may be coupled to the parallel feedback pin 236, the single resistor having a resistance equivalent to the parallel resistance value of all existing parallel-coupled transistors.

The averager 326 may include an example external resistor 328. The external resistor 328 is a precision resistor of a known value, such that the second trimmed resistor 330 can be tuned to have a resistance value approximately (e.g., +/−5%) equal to the external resistor 328. By having approximately equal resistance values, an approximately equal (e.g., +/−5%) amount of current passes through the external resistor 328 and the second trimmed resistor 330. In some examples, the external resistor 328 is a common external resistor used for both the die 116 and another parallel die (e.g., the die 120). In some examples, each die has its own external resistor.

Figure 4:
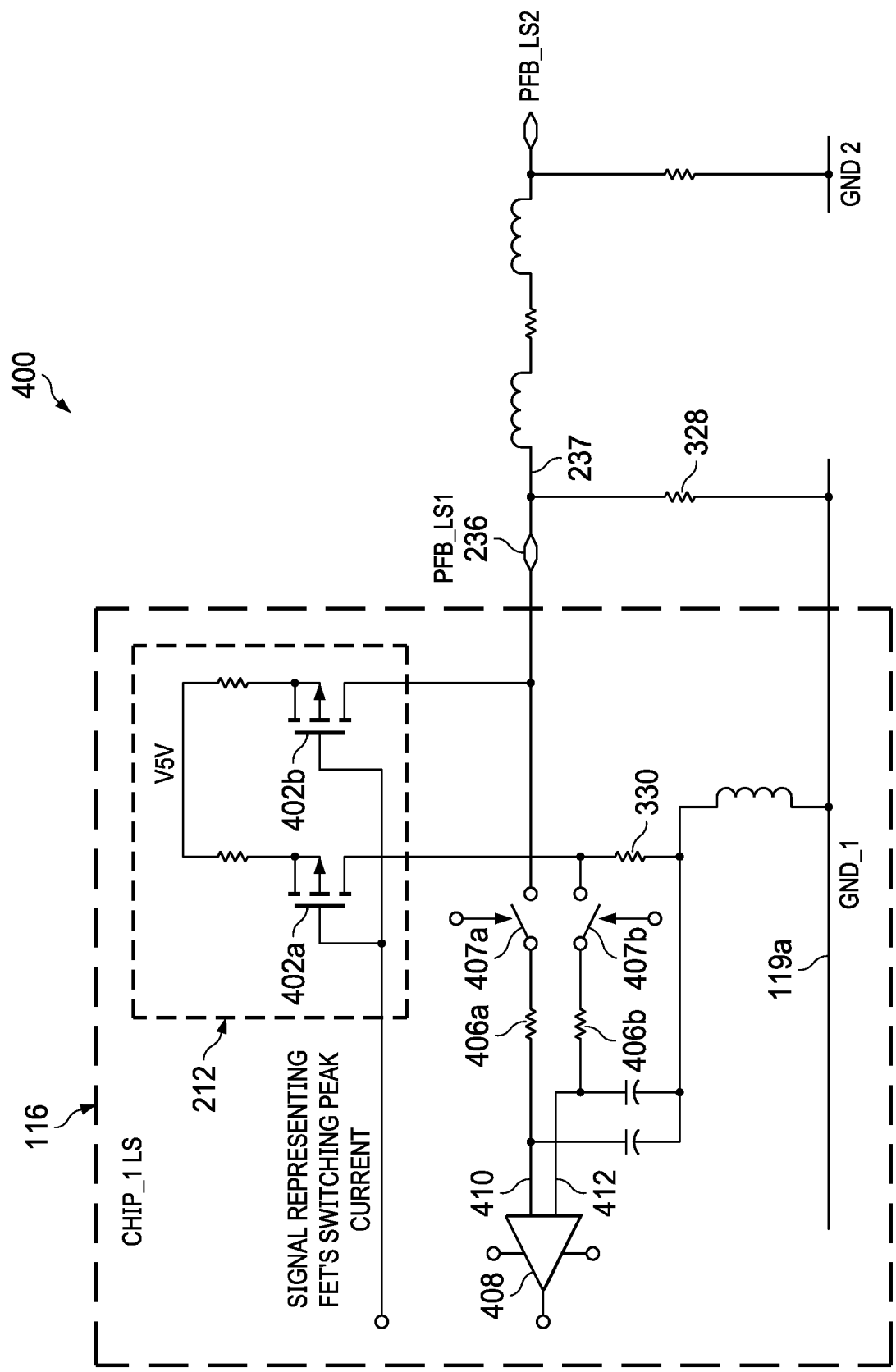
FIG. 4 is a schematic of an example section of the analog circuit of FIG. 3 to implement an example average current implementation of the active drive controller of FIG. 3 during an example passive drive mode.

In the illustrated example of FIG. 4, the external resistor 328 is coupled between the parallel feedback node 237 and the voltage bus node (e.g., the first local circuit ground 119*a* in the case of the die 116). In some examples, the external resistor 328 is coupled between the parallel feedback node 237 and the switched circuit node SW 117 (e.g., in the case of a high-side transistor). In some example implementations described herein, such as the follow-the-leader implementation illustrated in the sections 600, 700 of FIGS. 6 and 7, the external resistor 328 is unnecessary and is excluded. In the illustrated example of FIG. 4, the second trimmed resistor 330 is coupled to the chip voltage to current converter 212 and the voltage bus node (e.g., the first local circuit ground 119*a* in the case of the die 116). In some examples, the second trimmed resistor 330 is coupled to the chip voltage to current converter 212 and the switched circuit node SW 117.

In some examples, the averager 326 may include a set of parallel-coupled resistances in which the averager 326 generates a metric over the set of parallel-coupled resistances. In this example, the averager is implemented on an external circuit, coupled to at least one parallelization controller. Alternatively, the averager 326 may be implemented internally on the same circuit and/or die as the parallelization controller (e.g., the parallelization controller 130 or 134 of FIGS. 1 and 2). In some examples, the averager 326 may receive a single transistor initial peak current, the single transistor deemed the leader transistor. In some such examples, the output of the averager 326 is the initial peak current of the leader transistor. In the leader transistor case, the turn on and/or off times of the parallel-coupled are adjusted until their initial peak currents match the leader transistor peak current.

The example temperature sensor 332 is coupled to the output of the current sensor 138. The temperature sensing network 332 includes a sensing resistor (e.g., a thermistor), which obtains the temperature value of the low side transistor 306. The temperature sensing network 332 receives at least two voltage values, a bandgap temperature voltage 346, and a temperature voltage 348. The bandgap temperature voltage is a reference voltage independent of temperature. The bandgap temperature voltage 346 may range from 0 to 1.25V; however, the bandgap temperature voltage 346 is not limited to the above range. The temperature voltage 348 is dependent on the thermistor temperature. The temperature voltage 348 may also range from 0 to 1.2V; however, the temperature voltage is not limited to the above defined range. In some examples, the bandgap temperature voltage 346 has different upper or lower limits (such as 0V to 2V, 0V to 5V, etc.). The thermistor includes a variable resistor in which the resistance changes in response to changes in temperature. For example, a constant current will be forced through the thermistor. When the transistor heats up, the voltage over the resistor changes, therefore allowing for the temperature value to be measured. This value is then sent through a series of buffers and amplifiers to send a percentage of the transistor temperature value to the current sensor 138 output and the averager 326. Alternatively, the value sent to the edge delay controller 174 may be a weighted average of each individual transistor peak current plus a percentage of the individual transistor temperature information.

The example edge delay controller 174 is coupled to the averager 326, the temperature sensor 332, and the current sensor 138. The peak current and peak temperature values of the individual low side transistor 306 are received in the form of a voltage at the edge delay controller 174. Alternatively, the peak current and peak temperature vales of the individual low side transistor 306 may be received in the form of a current, temperature, voltage, etc., at the edge delay controller 174. Also, the average peak current and/or junction temperature values obtained from the averager 326 is sent to the edge delay controller 174.

In the illustrated example of FIG. 3, the example edge delay controller 174 of FIG. 2 includes the error amplifier 158. In some examples, the error amplifier 158 may be a separate component from the edge delay controller 174 (e.g., not included within the edge delay controller 174). In some such examples, the error amplifier 158 is coupled to the edge delay controller 174, as illustrated in the block diagram 200 of FIG. 2. The edge delay controller 174 includes buffers 336, 338, a difference amplifier 340, and a delay generator 342. A series of buffers may exist in place of the buffers 336, 338.

In the example described in FIG. 3, the positive input of the difference amplifier 340 is coupled to the output of the buffer 336. Also, the negative input of the difference amplifier 340 is coupled to output of the buffer 338. In other examples described herein, the negative input of the difference amplifier 340 may be coupled to the output of the buffer 336. Likewise, the positive input of the difference amplifier 340 may be coupled to the output of the buffer 338. The difference amplifier 340 generates a signal based on a comparison between the individual transistor peak current and the average transistor peak current. In other examples described herein, the difference amplifier 340 may generate a signal based on a comparison between the individual transistor temperature value and the average transistor temperature value.

The example edge delay controller 174 includes the delay generator 342. The delay generator 342 is coupled to the pulse width modulation (PWM) generator 304 and the output of the difference amplifier 340. The delay generator 342 may receive a current, voltage and/or temperature value from the difference amplifier 340. The delay generator 342 applies a delay (e.g., a shift in timing and/or frequency) to the signal from the PWM generator 304. The delay generator 342 may use the information received from the difference amplifier 340 and the PWM generator 304 to adjust the turn on and/or off times of the parallel-coupled transistors using an adjustment loop (such as servomechanism loop, etc.). The delay generator 342 sends information received from the difference amplifier 340 through an example servomechanism loop. A servomechanism loop, for example, uses error sensing feedback to control operations of the parallel-coupled transistors. The servomechanism loop generates a second signal which is an adjusted variant of the pulse width modulated signal. Also, additional servomechanism loops may exist for each individual transistor. Alternatively, the delay generator 342 may modify the signal from the PWM generator 304 in any way not directly described herein. The output of the delay generator 342 is coupled to the gate driver 344. The gate driver 344 communicates the output of the delay generator 342 and/or the output of the edge delay controller 174 generally to the control contact 307 of the low-side transistor 306.

The illustrated example of FIG. 3 includes the example active drive controller 182 of FIGS. 1 and 2. The active drive controller 182 of the illustrated example may be a current averaging type of active drive controller or a follow-the-leader type of active drive controller. An example of the current averaging type of active drive controller is illustrated and described in association with FIGS. 4-5. An example of the follow-the-leader type of active drive controller is illustrated and described in association with FIGS. 6-7.

FIG. 4 is a schematic of an example section 400 of the analog circuit 300 of FIG. 3 to implement an example average current implementation of the active drive controller 350 of FIG. 3 during an example passive drive mode. The section 400 includes the chip voltage to current converter 212, the parallel feedback pin 236, the external resistor 328, and the second trimmed resistor 330 from FIGS. 2 and 3. The section 400 of the analog circuit 300 includes example p-type field effect transistors (PFETs) 402a, 402b, example switched sampling resistors 406a, 406b, example resistor switches 407a, 407b, and an example delay operational amplifier 408. The passive drive mode occurs when an example current averaging active drive controller 501 is not in operation, and therefore not actively driving a voltage onto the parallel feedback pin 236. As a result, the current averaging active drive controller 501 is not illustrated in the section 400 of FIG. 4.

In the illustrated example of FIG. 4, the chip voltage to current converter 212 includes two example PFETs 402a, 402b. The PFETs 402a, 402b are current mirrored such that the current through the PFETs 402a, 402b is approximately equal (e.g., +/−1%). Therefore, the output of the voltage to current converter 212 is two currents, one of which connects to the parallel feedback pin 236, and the other of which is used internally (e.g., accessible by the delay operational amplifier 408 via the switched sampling resistors 406a, 406b), thereby enabling comparison of the peak current on the die 116 with peak currents on other parallel dies (e.g., the die 120).

The example switched sampling resistors 406a, 406b of the illustrated example of FIG. 4 connect respectively to the parallel feedback node 237 including the parallel feedback pin 236 and the line including the current value representing the peak current on the die 116. The switched sampling resistors include a first switched sampling resistor 406a and a second switched sampling resistor 406b. In the illustrated example of FIG. 4, the first switched sampling resistor 406a is coupled to an example first resistor switch 407a and to the delay operational amplifier 408. In the illustrated example of FIG. 4, the second sampling resistor 406b is coupled to an example second resistor switch 407b and to the delay operational amplifier 408. In the illustrated example of FIG. 4, the first resistor switch 407a is coupled to the first switched sampling resistor 406a and the parallel feedback node 237 including the parallel feedback pin 236. The second resistor switch 407b is coupled to the second switched sampling resistor 406b and second trimmed resistor 330. In some examples, the first resistor switch 407a and the second resistor switch 407b are modulated synchronously. Therefore, when the first resistor switch 407a and the second resistor switch 407b are closed, the delay operational amplifier 408 is able to compare the peak current value on the die 116 with a current value representing average of peak currents on parallel dies (e.g., the die 120).

The delay operational amplifier 408 includes an example first input 410 and an example second input 412. In the illustrated example of FIG. 4, when the first resistor switch 407a is closed, the first input 410 is coupled to the parallel feedback node 237. In the illustrated example of FIG. 4, when the second resistor switch 407b is closed, the second input 412 is coupled to the second trimmed resistor 330. As used herein, the process of closing the first and second switches 407a, 407b is referred to as "sampling." During sampling, the delay operational amplifier 408 of the illustrated example of FIG. 1 compares the current and/or voltage values on the die 116 with current and/or voltage values on the parallel feedback node 237 including the parallel feedback pin 236. In some examples, the sampling period is determined based on the resistor-capacitor (RC) time constant of the filter in front of the error amplifier 158. By using a time proportional to the RC time constant of the filter, two separate dies would process signals with similar time constants and adjust PWM delays with similar time constants. The example delay operational amplifier 408 of the illustrated example of FIG. 4 outputs a value corresponding to a difference between the peak current observed on the die 116 on which the delay operational amplifier 408 is installed and the average of peak current observed on parallel dies. In some examples, the delay operational amplifier 408 provides an output value to the edge delay controller 174 to cause the timing of the pulse width modulated signal to be adjusted to better synchronize voltage levels between parallel transistors. In some examples, the delay operational amplifier 408 is a component of the error amplifier 158 and/or the edge delay controller 174 of FIGS. 1-3.

Figure 5:
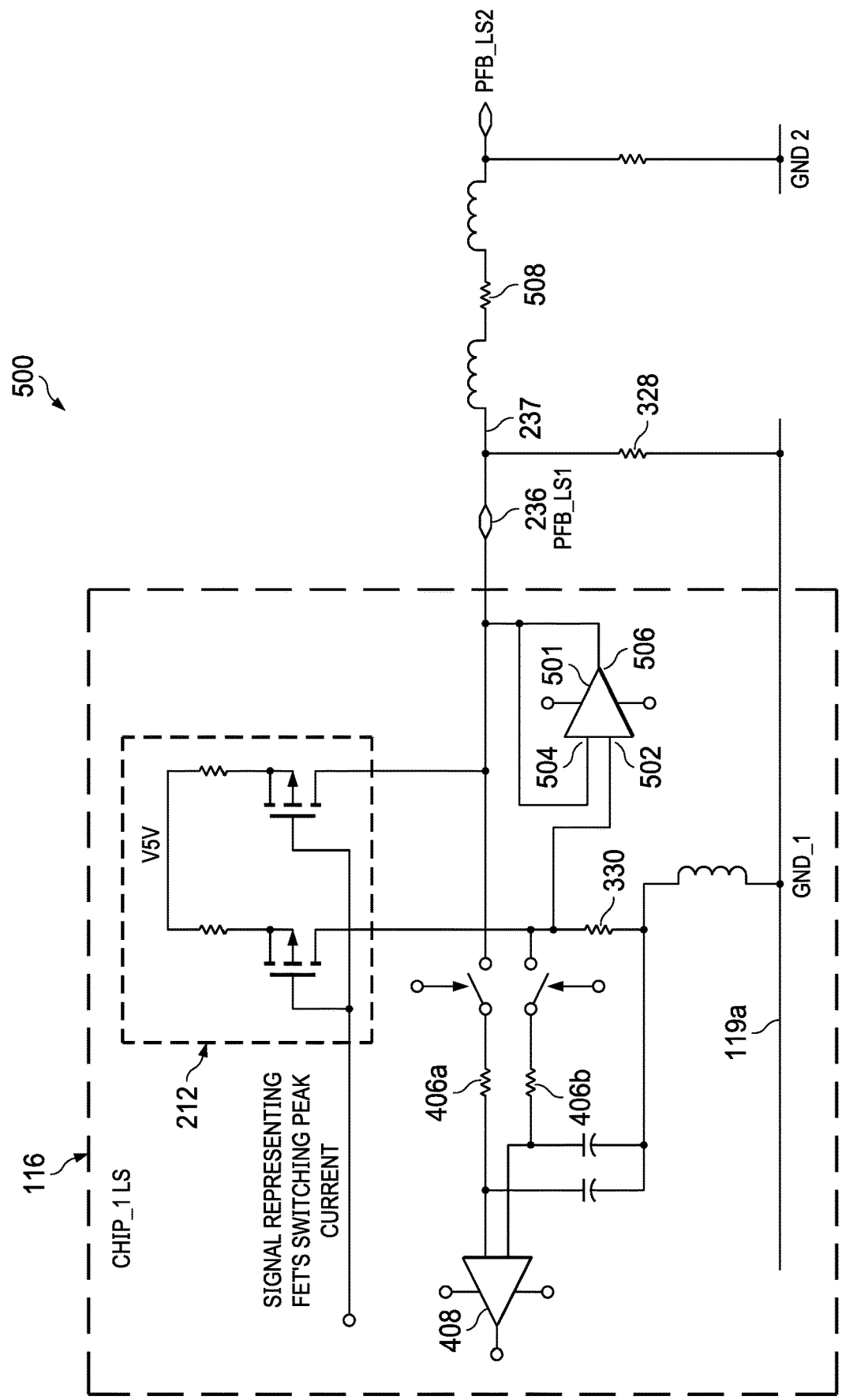
FIG. 5 is a schematic of an example section of the analog circuit of FIG. 3 to implement an example average current implementation of the active drive controller of FIG. 3 during an example active drive mode.

FIG. 5 is a schematic of an example section 500 of the analog circuit 300 of FIG. 3 to implement an example average current implementation of the active drive controller 182 of FIG. 3 during an example active drive mode. The example section 500 includes an example current averaging active drive controller 501 and an example buffering resistor 508. The current averaging active drive controller 501 includes an example first input 502, an example second input 504, and an example output 506. The first input 502 of the illustrated example of FIG. 5 is coupled to the second trimmed resistor 330. As a result, the current averaging active drive controller 501 can determine a voltage value across the second trimmed resistor 330 which is proportional to current through the transistor on the die 116 (e.g., the transistor 105 of FIG. 1). The second input 504 of the illustrated example of FIG. 5 is coupled to the parallel feedback pin 236 and the parallel feedback node 237. The output 506 of the current averaging active drive controller 501 is coupled to the parallel feedback pin 236 and the parallel feedback node 237. In the illustrated example of FIG. 5, the current averaging active drive controller 501 can access a voltage output corresponding to a peak voltage through the transistor 105 on the die 116 by determining a voltage across the second trimmed resistor 330. In this manner, the current averaging active drive controller 501 can determine whether to actively drive a voltage onto the parallel feedback pin 236 to attempt to reduce voltage ringing (e.g., quick voltage fluctuations) associated with switching events. In the average current implementation, each parallel die outputs a voltage proportional to the peak current on that die, and therefore the voltage on the parallel feedback node 237 is representative of the average of the peak currents of all dies.

The section 400 of FIG. 4 does not illustrate the current averaging active drive controller 501 because the current averaging active drive controller 501 is not active during the passive drive mode. During the active drive mode, as illustrated in FIG. 5, the current averaging active drive controller 501 drives (such as causes, outputs, etc.) a voltage onto the parallel feedback pin 236. In some examples, the analog circuit 300 includes a mode controller to switch between the passive drive mode and the active drive mode. For example, to switch between the passive drive mode and the active drive mode, the mode controller may switch a connection to enable the current averaging active drive controller 501.

The example current averaging active drive controller 501 of the illustrated example of FIG. 5 is an example implementation of the active drive controller 182 of FIGS. 1-3. The current averaging active drive controller 501 receives a voltage value corresponding to the peak voltage on the die 116. The current averaging active drive controller 501 drives a voltage value based on a peak voltage on the die 116 (e.g., received via the first input 502) and a voltage value corresponding to other peak voltages on parallel dies (e.g., received via the second input 504) onto the parallel feedback pin 236, in the illustration of FIG. 5). In some examples, the current averaging active drive controller 501 is a unity gain buffer. In some examples, the current averaging active drive controller 501 is an operational amplifier. In some examples, the current averaging active drive controller 501 is activated in response to a voltage fluctuation being detected (e.g., a voltage fluctuation associated with switching of parallel transistors). In some examples, when the current averaging active drive controller 501 is actively outputting a voltage onto the parallel feedback pin 236, the blanking period occurs. For example, while the current averaging active drive controller 501 is actively driving a voltage on the parallel feedback pin 236 and/or for a specified duration after (e.g., defined by a timing window), the resistor switches 407a, 407b associated with the switched sampling resistors 406a, 406b may remain open, thereby preventing sampling from occurring. For example, a timing window may be defined based on an expected duration of voltage ringing following a switching event. In some examples, during a first portion (such as first 50%, the first 70%, etc.) of this timing window, the current averaging active drive controller 501 outputs a voltage onto the parallel feedback pin 236 to attempt to reduce and/or eliminate the voltage ringing. In some such examples, during the second portion of the timing window, the current averaging active drive controller 501 no longer actively drives the voltage. For example, the second portion of the timing window is useful to allow some remaining time for any residual voltage ringing to diminish passively (such as without actively driving, by itself, etc.). In some examples, the timing window is controlled by the timing controller 242 of FIG. 2. Detailed illustration and description of example sampling periods and blanking periods is further described in connection the signal diagrams of FIGS. 11A-11B.

The example buffering resistor 508 of the illustrated example of FIG. 5 dampens the effect of active drive controllers on parallel dies attempting to adjust the voltage on the parallel feedback pins. For example, when the current averaging active drive controller 501 is outputting a voltage onto the parallel feedback pin 236, a similar active drive controller (on a parallel die) may be outputting a different voltage onto its parallel feedback pin, which is connected on the parallel feedback node 237 to the parallel feedback pin 236. To avoid rapid fluctuations due this voltage fighting effect, the buffering resistor 508 reduces rapid voltage fluctuations and has an averaging effect such that the parallel feedback node 237 connecting the two dies has a voltage value representative of the average of the voltages output by the respective active drive controllers.

Figure 6:
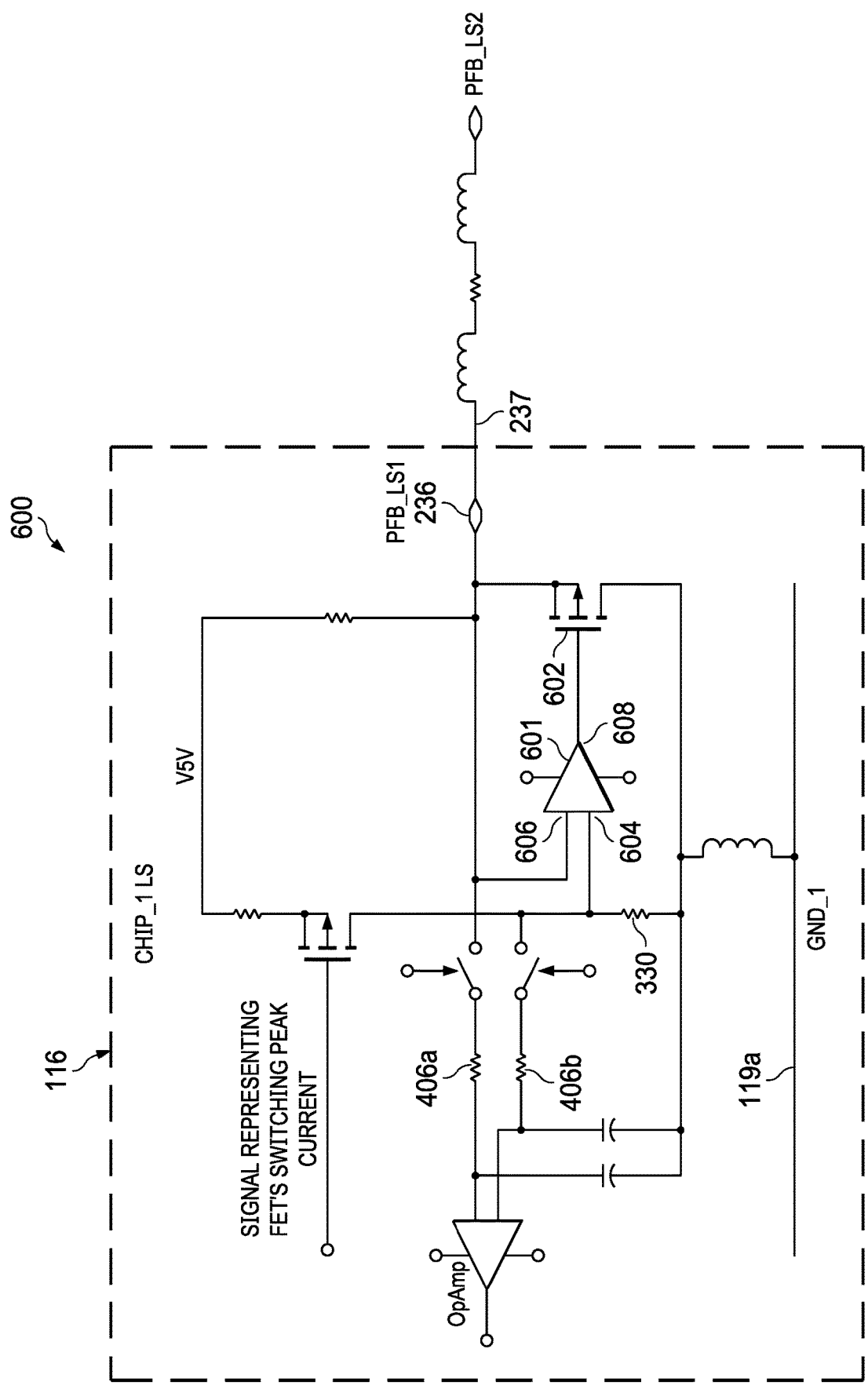
FIG. 6 is a schematic of an example section of the analog circuit of FIG. 3 to implement an example follow-the-leader implementation of the active drive controller of FIG. 2 during an example passive drive mode.

FIG. 6 is a schematic of an example section 600 of the analog circuit 300 of FIG. 3 to implement an example follow-the-leader implementation of the active drive controller 182 of FIG. 3 during an example passive drive mode. Unlike the sections 400, 500 of the current averaging implementation illustrated in FIGS. 4 and 5, the section 600 of FIG. 6 does not require an external trimmed resistor (e.g., the external resistor 328 in FIG. 3). In an example of the follow-the-leader implementation, out of a set of parallel dies, the active drive controller on the die with the lowest voltage representing its peak current value (e.g., the leader) drives its voltage onto the parallel feedback node 237 between the parallel dies (e.g., onto the parallel feedback pin 236) in passive drive mode. In such an example, the leader condition is satisfied when a voltage level on a die is lower than voltage levels on parallel dies. In some such examples, the other die(s) (which do not have the lowest voltage value representing their peak current) are not driving a voltage onto the parallel feedback node 237, and thus their respective active drive controller(s) see a difference between the voltage on their dies and the voltage on the parallel feedback node 237. In response to this difference, the edge delay controller on these die(s) can modulate their edge delay times (e.g., via the edge delay controllers 172, 174, 176, 178) to better synchronize their voltage levels with the leader and thus rapidly reduce peak switching current differences in between dies.

The section 600 of the follow-the-leader implementation includes an example follow-the-leader active drive controller 601. Also, the example section 600 includes an example follow-the-leader switch 602. In some examples, the follow-the-leader active drive controller 601 includes the follow-the-leader switch 602 and/or an example bypass connection 704 (illustrated and described in association with section 800 of FIG. 8).

In the illustrated example of FIG. 6, the follow-the-leader switch 602 is a PFET. In some examples, the follow-the-leader switch 602 is an n-type field effect transistor (NFET). In some examples, during the passive drive mode, the follow-the-leader active drive controller 601 can pull down (reduce) the voltage on the parallel feedback pin 236 when the voltage on the die 116 (e.g., the voltage representing the peak current on the die 116) is lower than a voltage representing a peak current on a parallel die (indicating the die 116 is the leader, because it has a lower voltage level). Thus, during passive mode, the follow-the-leader active drive controller 601 can, via the example follow-the-leader switch 602, drive the overall voltage level on parallel dies down to the lowest level on any one of the parallel dies. In some examples, the passive drive mode may be alternatively able to select a leader based on a highest voltage, and therefore drive the overall voltage level on the parallel dies to that of the highest individual voltage level on any of the parallel dies. During the passive drive mode, the follow-the-leader active drive controller 601 attempts to regulate the voltage to adjust for differences between parallel dies. In some examples, during the passive drive mode, sampling occurs at regular intervals (e.g., based on a signal from the timing controller 244 of FIG. 2).

The follow-the-leader active drive controller 601 of the illustrated example of FIG. 5 includes an example first input 604, an example second input 606, and an example output 608. The first input 604 of the follow-the-leader active drive controller 601 is coupled to the second trimmed resistor 330. Similarly to the first input 502 of the current averaging active drive controller 501 of FIG. 5, the first input 604 enables the follow-the-leader active drive controller 601 to determine a voltage value across the second trimmed resistor 330 which is proportional to a current (e.g., a peak current) through the transistor on the die 116 (e.g., the transistor 105 of FIG. 1). In some examples, the first input 604 of the follow-the-leader active drive controller 601 of FIG. 6 is coupled to the current sensor 138. The second input 606 of the follow-the-leader active drive controller 601 of FIG. 6 is coupled to the parallel feedback pin 236 and the parallel feedback node 237. The output 608 of the follow-the-leader active drive controller 601 is coupled to the parallel feedback pin 236 and the parallel feedback node 237 via the follow-the-leader switch 602.

The example follow-the-leader switch 602 connects the follow-the-leader active drive controller 601 with the parallel feedback pin 236 in order to enable the follow-the-leader active drive controller 601 to reduce a voltage level on the parallel feedback pin (e.g., drive the voltage down to the ground level, until it is equal to the voltage on the die 116). In the sections 600, 700 of FIGS. 6-7, the follow-the-leader active drive controller 601 includes an operational amplifier. The follow-the-leader active drive controller 601 accesses a voltage associated with parallel transistors via the second input 606 and a voltage associated with the peak voltage on the die 116 via the first input 604. In response to the voltage associated with peak voltage on the die 116 being lower than the voltage associated with parallel transistors (e.g., voltage from the parallel feedback pin 236), the follow-the-leader switch 602 closes, enabling connection between the parallel feedback pin 236 and the first local circuit ground 119a. As a result, the voltage on the parallel feedback pin 236 is reduced until the voltage level is equal to the peak voltage level on the die 116. Once these voltage values are equal, the follow-the-leader switch 602 opens, preventing further voltage decrease on the parallel feedback pin 236.

In some implementations, the follow-the-leader active drive controller 601 can alternatively drive the voltage up, and instead have a configuration where the leader is the die with the highest voltage level. For example, the follow-the-leader switch 602 could be coupled along with the follow-the-leader active drive controller 601 between the higher voltage bus node (e.g., the positive voltage bus 5-10V above the switched circuit node SW 117) and the parallel feedback pin 236.

Figure 7:
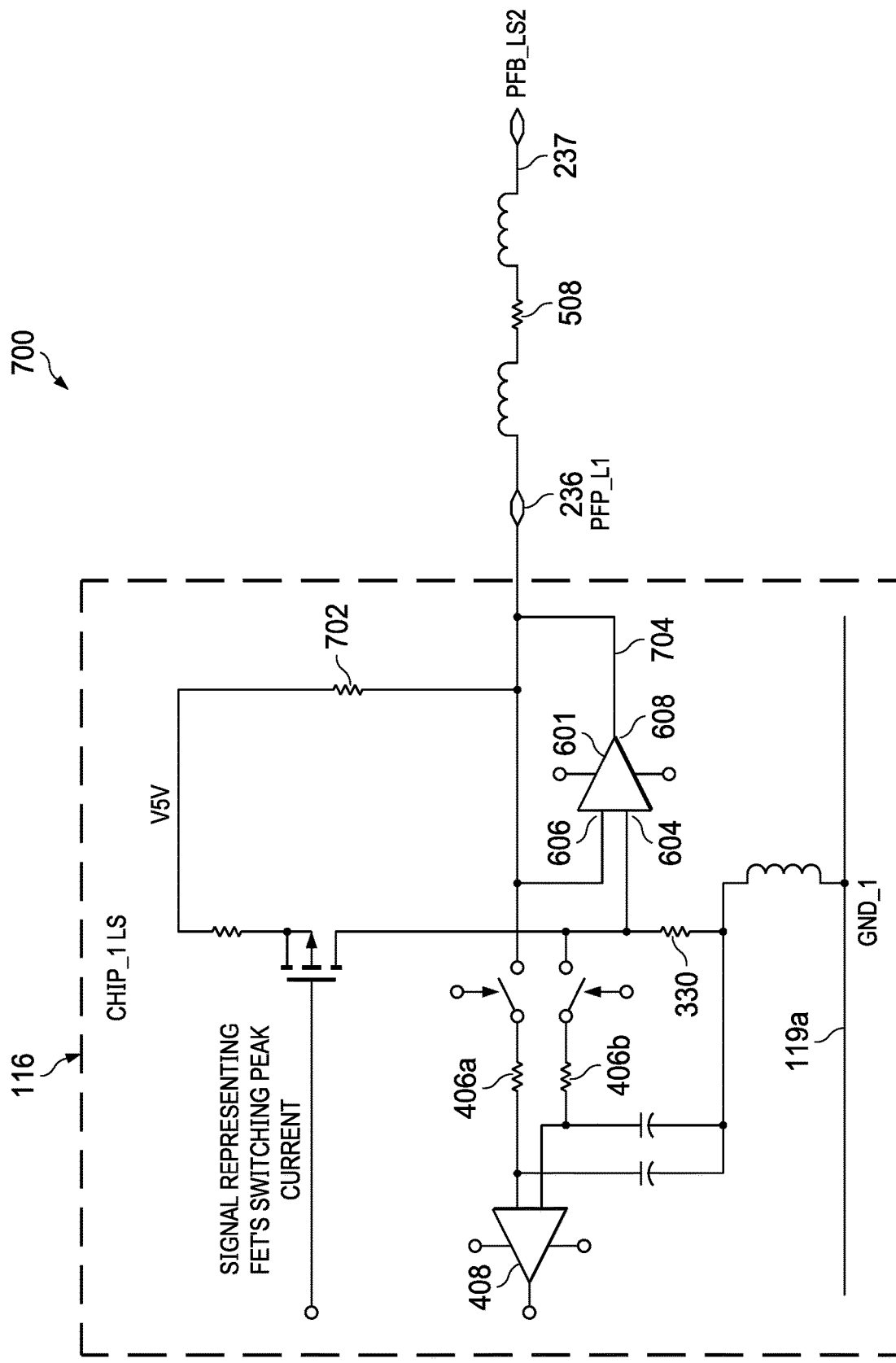
FIG. 7 is a schematic of an example section of the analog circuit of FIG. 3 to implement an example follow-the-leader implementation of the active drive controller of FIG. 2 during an example active drive mode.

FIG. 7 is a schematic of an example section 700 of the analog circuit 300 of FIG. 3 to implement an example follow-the-leader implementation of the active drive controller 182 of FIG. 3 during an example active drive mode. While the passive drive mode is capable of driving the voltage down based on a lowest voltage level on one of the parallel dies, the active drive mode is capable of quickly stabilizing a voltage level on the parallel feedback pin 236 in response to voltage bounces. For example, if the voltage level on the parallel feedback pin 236 needs to be increased, rather than decreased, it will take a significant amount of time for this to occur, due to an example resistor 702 between the high-side voltage and the parallel feedback pin 236. During the active drive mode, an example bypass connection 704 directly connects the follow-the-leader active drive controller 601 to the parallel feedback pin 236 to help stabilize voltages on the die 116 when voltage bounces occur (e.g., due to parallel transistor switching).

The example bypass connection 704 of the illustrated example section 700 connects the follow-the-leader active drive controller 601 to the parallel feedback pin 236. In some examples, the bypass connection 704 can be created via a switch. In some such examples, the bypass connection 704 couples the parallel feedback node 237 and the follow-the-leader active drive controller 601 in response to the active drive controller transition into an active drive mode (e.g., by closing the switch and enabling the bypass connection 704). In the illustrated example of FIG. 7, the follow-the-leader switch 602 is not visible, because the bypass connection 704 bypasses the follow-the-leader switch 602, directly coupling the follow-the-leader active drive controller 601 with the parallel feedback node 237. In some examples, when the bypass connection 704 is active (e.g., during active drive mode), sampling may be paused/delayed via the switched sampling resistors 406a, 406b (resistor switches 407a, 407b).

Figure 8:
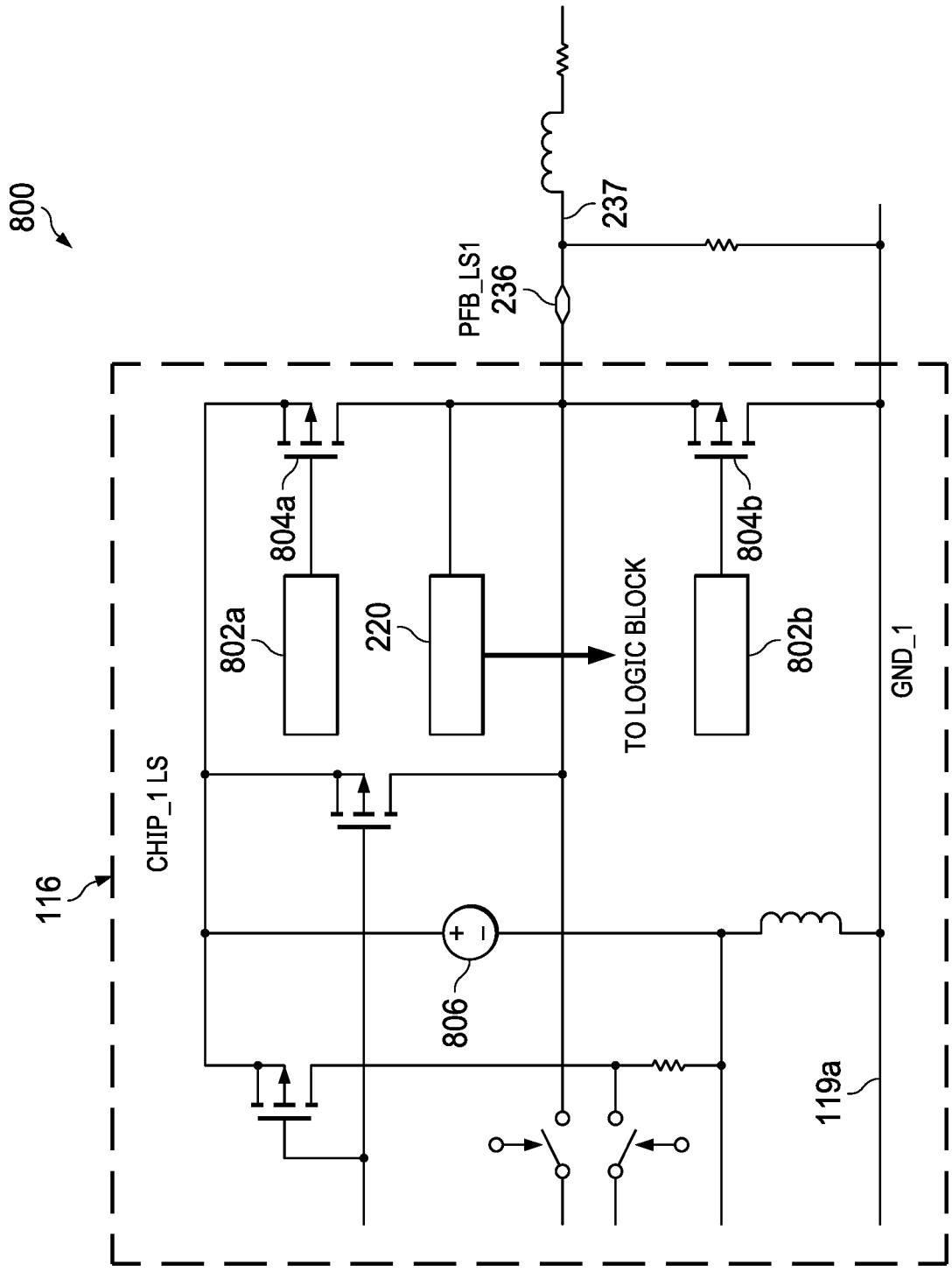
FIG. 8 is an illustration of an example analog circuit to implement the example fault monitor and the example fault indicator of FIG. 2.

FIG. 8 is an illustration of an example analog circuit 800 to implement the example fault monitor 220 and the example fault indicator 228 of FIG. 2. As in examples described above, the analog circuit 800 illustrates the example die 116. However, the description of the analog circuit 800 applies equally to any one of the dies 114, 116, 118, 120. Also, while the analog circuit 800 includes aspects of the sections 400, 500 of the average current implementation of the active drive controller 182 (e.g., the external resistor 328), the same fault monitor and fault indicator components illustrated in the analog circuit 800 of FIG. 8 can be implemented in a follow-the-leader implementation. The analog circuit 800 of FIG. 8 includes the example fault monitor 220 of FIG. 2, an example first fault indicator 802a, an example second fault indicator 802b, an example first indicator switch 804a, an example second indicator switch 804b, and an example analog supply source 806.

The example first fault indicator 802a and the example second fault indicator 802b are example implementations of the fault indicator 228 of FIG. 2. The first fault indicator 802a is an excess frequency indicator. In some examples, in response to a frequency observed in the voltage values on the die 116 exceeding a maximum frequency threshold, the first fault indicator 802a can cause the first indicator switch 804a to close, and thereby drive the voltage level on the parallel feedback node 237 connected to the parallel feedback pin 236 to a specified high value (such as 5V, 10V, 5-10V above a voltage of the local circuit ground PGND 119 or the switched circuit node SW 117, etc.). The first indicator switch 804a is coupled to the first fault indicator 802a, the parallel feedback node 237, and the analog supply source 806. The second indicator switch 804b is coupled to the second fault indicator 802b, the parallel feedback node 237, and the first local circuit ground 119a. In some examples, the second indicator switch 804b may be coupled to one of the local switched circuit nodes 117a, 117b (e.g., in the case of a high-side transistor). In some examples, the example analog supply source 806 quickly connects the parallel feedback node 237 with a constant high voltage value (such as 5V, 10V, etc.). In some examples, other fault conditions can be detected by the fault indicator 228, resulting in the voltage level on the parallel feedback node 237 being decreased in response to detecting the fault. The example second fault indicator 802b can detect faults such overcurrent faults, overtemperature faults, and/or undervoltage faults. In response to the second fault indicator 802b detecting a fault, the second indicator switch 804b can directly connect the parallel feedback node 237 with a ground (e.g., example first local circuit ground node 119a). Thus, the voltage level is quickly reduced on the parallel feedback pin 236, and other parallel dies can detect the fault condition (by monitoring for the change in voltage levels). Similarly, when the first fault indicator 802a is triggered (e.g., the first indicator switch 804a closes), other parallel dies can detect a fault on the die 116 by observing the increase in voltage on the parallel feedback pin 236. In the illustrated example of FIG. 4, the first indicator switch 804a is a PFET (for pulling up the voltage), and the second indicator switch 804b is an NFET (for pulling down the voltage).

The example fault monitor 220 of the illustrated example of FIG. 8 monitors for changes in voltage levels on the parallel feedback node 237 and identifies fault conditions on parallel dies. The fault monitor 220 of the illustrated example of FIG. 8 is coupled to the parallel feedback node 237 and a logic block on the die 116. For example, if the voltage on the parallel feedback pin 236 changes outside of upper or lower threshold values, or if the voltage on the parallel feedback pin 236 changes at a rate exceeding a threshold, the fault monitor 220 can identify a fault condition on one or more parallel dies. In some examples, in response to identifying a fault condition, the fault monitor 220 communicates the fault condition to a logic block on the die 116. Thereafter, the logic block can cause changes to operations on the die, such as ceasing parallelization until the fault is rectified. For example, in response to the fault monitor 220 detecting an excess frequency condition on a parallel die, the edge delay controller 174 can be disabled to prevent parallel cooperation of PWM edge modulation until the fault condition is corrected. In some examples, in response to the fault monitor 220 detecting a different fault other than one associated with an excess frequency condition (such as an overcurrent fault, an overtemperature fault, etc.), the transistor 105 can be temporarily disabled until the fault condition is corrected. For example, a terminal of the transistor 105 can be connected with a high impedance (e.g., HiZ'd) in order to disable the transistor 105 in response to the fault monitor 220 detecting the fault condition. In some examples, in response to detecting a fault, the fault monitor 220 can communicate to the timing controller 242 to adjust (e.g., delay) timing of sampling.

Figure 9:
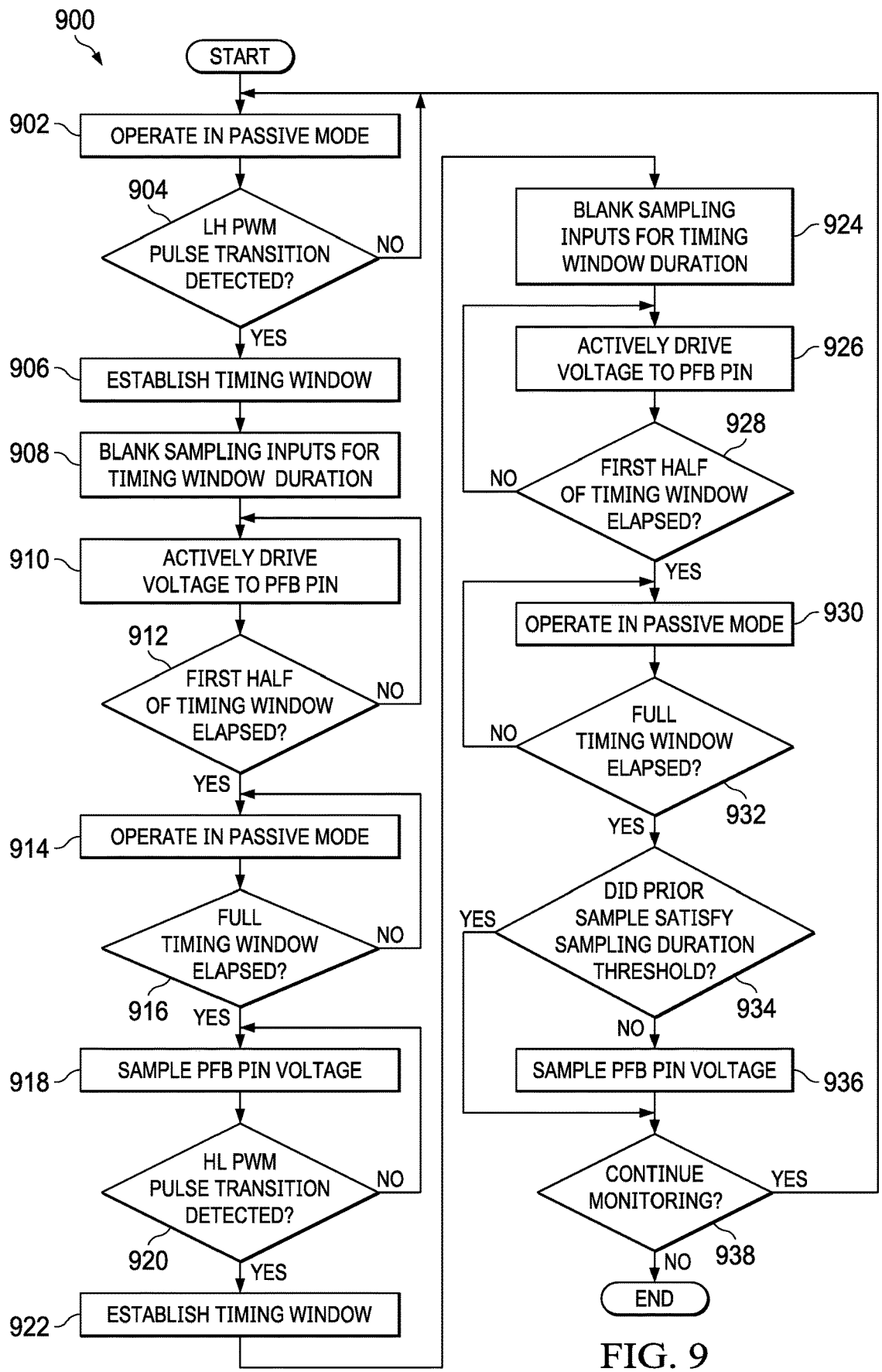
FIG. 9 is a flowchart representative of example computer readable instructions that may be executed to implement the parallelization controllers of the example analog circuits represented in FIGS. 1-8.
Figure 10:
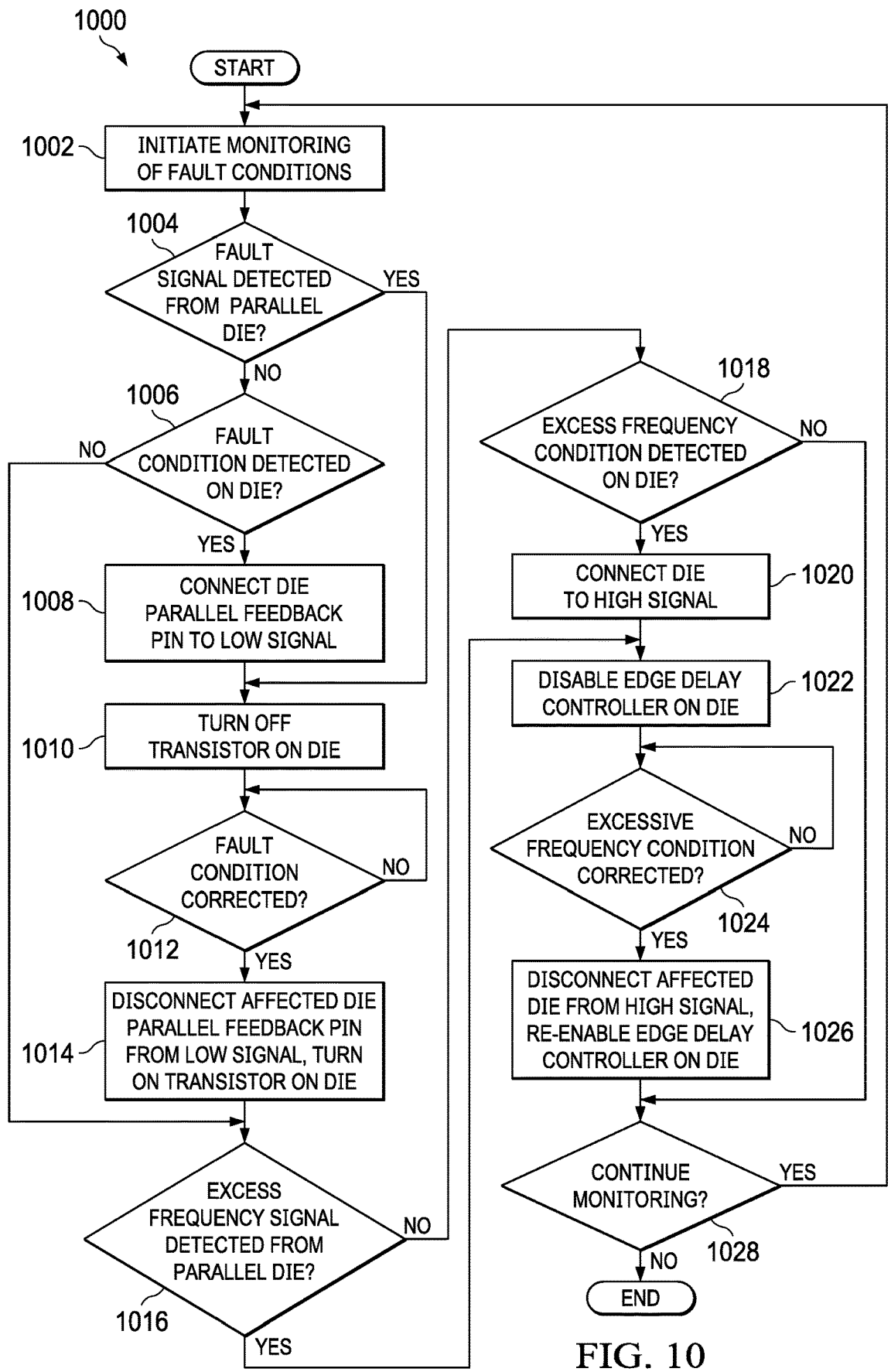
FIG. 10 is a flowchart representative of example computer readable instructions that may be executed to implement the parallelization controllers of the example analog circuits represented in FIGS. 1, 2 and 8 for fault monitoring.

Flowcharts representative of example hardware logic, machine readable instructions, hardware implemented state machines, and/or any combination thereof for implementing the parallelization controller 130 (and/or any of the parallelization controllers 128, 130, 132, 134) of FIG. 2 are shown in FIGS. 9-10. The machine readable instructions may be one or more executable programs or portion(s) of an executable program for execution by a computer processor such as the processor 1912 shown in the example processor platform 1900 described below in connection with FIG. 19. The program may be embodied in software stored on a non-transitory computer readable storage medium such as a CD-ROM, a floppy disk, a hard drive, a DVD, a Blu-ray disk, or a memory associated with the processor 1912, but the entire program and/or parts thereof could alternatively be executed by a device other than the processor 1912 and/or embodied in firmware or dedicated hardware. Further, although the example program is described with reference to the flowchart illustrated in FIGS. 9-10, many other methods of implementing the example parallelization controller 130 may alternatively be used. For example, the order of execution of the blocks may be changed, and/or some of the blocks described may be changed, eliminated, or combined. Additionally or alternatively, any or all of the blocks may be implemented by one or more hardware circuits (such as discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (such as portions of instructions, code, representations of code, etc.) useful to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (such as settings stored, data input, network addresses recorded, etc.) before the machine readable instructions and/or the corresponding program(s) can be executed in whole or in part. Thus, the described machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As described above, the example processes of FIGS. 9-10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; or (g) A with B and with C. Also, as used herein, the phrase "at least one of A or B" (or "at least one of A and B") refers to implementations including any of: (a) at least one A; (b) at least one B; or (c) at least one A and at least one B.

FIG. 9 is a flowchart representative of example computer readable instructions 900 that may be executed to implement the parallelization controllers of the example analog circuits 100, 300 represented in FIGS. 1-7 in accordance with the teachings of this description. As in the drawings described above, the computer readable instructions 900 are described with reference to the die 116 and the parallelization controller 130. However, the same computer readable instructions 900 are equally applicable to any of the dies 114, 116, 118, 120 and/or any of the parallelization controllers 128, 130, 132, 134. With reference to the drawings described above, the example computer readable instructions 900 begin at block 902 with the parallelization controller 130 operating in a passive mode. In some examples, the example active drive controller 182 operates in a passive mode. For example, the parallelization controller 130 can be operated in a passive mode in accordance with the configuration of the section 400 of FIG. 4 of the analog circuit 300 (e.g., in an average current implementation) and/or in accordance with the configuration of the section 600 of FIG. 6 of the analog circuit 300 (e.g., in a follow-the-leader circuit implementation).

At block 904, the example parallelization controller 130 determines whether the PWM pulse transition has been detected. In some examples, the timing controller 244 determines whether the low to high (LH) PWM pulse transition has been detected. In some examples, the current sensor 138 determines whether the LH PWM pulse transition has been detected based on a current through the transistor 105. In response to the PWM pulse transition being detected, processing transfers to block 906. Conversely, in response to the PWM pulse transition not being detected, processing transfers to block 902.

At block 906, the example parallelization controller 130 establishes a timing window. In some examples, the timing controller 244 establishes a timing window. In some examples, the duration of the timing window is set based upon an expected amount of time required to eliminate voltage ringing associated with switching of parallel transistors. In some examples, the timing controller 244 begins a timer to timer up to the timing window duration.

At block 908, the example parallelization controller 130 blanks (such as blocks, switches, etc.) the sampling inputs for the timing window duration. In some examples, the timing controller 244 blanks the sampling inputs. In some examples, the first resistor switch 407a and the second resistor switch 407b remain open during the blanking period, preventing the delay operational amplifier 408 from adjusting the pulse width edge timing until the blanking period is complete.

At block 910, the example parallelization controller 130 actively drives the voltage to the parallel feedback pin 236. In some examples, the active drive controller 182 actively adjusts the voltage on the parallel feedback pin 236. In some examples, the active drive controller 182 adjusts the voltage on the parallel feedback pin 236 based on an average current implementation, as illustrated by the section 500 of FIG. 5. In some examples, the active drive controller 182 adjusts the voltage on the parallel feedback pin 236 based on a follow-the-leader implementation, as illustrated by the section 700 of FIG. 7.

At block 912, the example parallelization controller 130 determines whether the first half of the timing window has elapsed. In some examples, the timing controller 244 determines whether the first half of the timing window has elapsed. Some examples may use a different threshold (such as a first third, a first two-thirds, a fixed duration of time, etc.). In response to the first half of the timing window having elapsed, processing transfers to block 914. Conversely, in response to the first half of the timing window not having elapsed, processing transfers to block 910.

At block 914, the example parallelization controller 130 operates in passive mode. For example, the parallelization controller 130 can be operated in a passive mode in accordance with the configuration of the section 400 of FIG. 4 of the analog circuit 300 (e.g., in an average current implementation) and/or in accordance with the configuration of the section 600 of FIG. 6 (e.g., in a follow-the-leader circuit implementation). In some examples, the active drive controller 182 operates in a passive mode.

At block 916, the example parallelization controller 130 determines whether a full timing window has elapsed. In some examples, the timing controller 244 determines whether a full timing window has elapsed. In response to the full timing window having elapsed, processing transfers to block 918. Conversely, in response to the full timing window not having elapsed, processing transfers to block 914.

At block 918, the example parallelization controller 130 samples the parallel feedback pin voltage. In some examples, the error amplifier 158 and/or the edge delay controller 174 samples the voltage level of the parallel feedback pin 236. For example, as described in the description associated with FIG. 4, the first resistor switch 407a and the second resistor switch 407b can close, enabling the parallel feedback pin 236 and the chip voltage to current converter 212 to be directly connected with the delay operational amplifier 408. In some examples, the delay operational amplifier outputs a signal that is useful to regulate the PWM pulse edge timing and thereby reduce future voltage ringing during switching events.

At block 920, the example parallelization controller 130 determines whether the high-to-low (HL) PWM pulse transition has been detected. In some examples, the timing controller 244 determines whether the HL PWM pulse transition has been detected. In some examples, the current sensor 138 determines whether the PWM pulse transition has been detected based on a current through the transistor 105. In response to the PWM pulse transition being detected, processing transfers to block 922. Conversely, in response to the PWM pulse transition not being detected, processing transfers to block 9018.

At block 922, the example parallelization controller 130 establishes a timing window. In some examples, the timing controller 244 establishes a timing window. In some examples, the duration of the timing window is set based upon an expected amount of time required to eliminate voltage ringing associated with switching of parallel transistors. In some examples, the timing controller 244 begins a timer to time up to the timing window duration.

At block 924, the example parallelization controller 130 blanks the sampling inputs for the timing window duration. In some examples, the timing controller 244 blanks the sampling inputs. In some examples, the first resistor switch 407a and the second resistor switch 407b remain open during the blanking period, preventing the delay operational amplifier 408 from adjusting the pulse width edge timing until the blanking period is complete.

At block 926, the example parallelization controller 130 actively drives the voltage to the parallel feedback pin 236. In some examples, the active drive controller 182 actively adjusts the voltage on the parallel feedback pin 236. In some examples, the active drive controller 182 adjusts the voltage on the parallel feedback pin 236 based on an average current implementation, as illustrated by the section 500 of FIG. 5. In some examples, the active drive controller 182 adjusts the voltage on the parallel feedback pin 236 based on a follow-the-leader implementation, as illustrated by the section 700 of FIG. 7.

At block 928, the example parallelization controller 130 determines whether the first half of the timing window has elapsed. In some examples, the timing controller 244 determines whether the first half of the timing window has elapsed. Some examples may use a different threshold (such as a first third, a first two-thirds, a fixed duration of time, etc.). In response to the first half of the timing window having elapsed, processing transfers to block 930. Conversely, in response to the first half of the timing window not having elapsed, processing transfers to block 926.

At block 930, the example parallelization controller 130 operates in passive mode. For example, the parallelization controller 130 can be operated in a passive mode in accordance with the configuration of the section 400 of FIG. 4 of the analog circuit 300 (e.g., in an average current implementation) and/or in accordance with the configuration of the section 600 of FIG. 6 of the analog circuit 300 (e.g., in a follow-the-leader circuit implementation). In some examples, the active drive controller 182 operates in a passive mode.

At block 932, the example parallelization controller 130 determines whether a full timing window has elapsed. In some examples, the timing controller 244 determines whether a full timing window has elapsed. In response to the full timing window having elapsed, processing transfers to block 934. Conversely, in response to the full timing window not having elapsed, processing transfers to block 930.

At block 934, the example parallelization controller 130 determines whether the prior sample satisfied the sampling duration threshold. In some examples, the timing controller 244 determines whether the prior sample (e.g., collected at block 918) satisfied the sampling duration threshold. In some examples, the sampling duration threshold may be a set period. In some examples, the sampling duration threshold is a variable amount of time based on the behavior of the system (e.g., if voltage ringing is not being quickly reduced, a longer sampling duration may be dynamically implemented). In response to the prior sample satisfying the sampling duration threshold, processing transfers to block 938. Conversely, in response to the prior sample not satisfying the sampling duration threshold, processing transfers to block 936.

At block 936, the example parallelization controller 130 samples the voltage on the parallel feedback pin 236. In some examples, the error amplifier 158 and/or the edge delay controller 174 samples the voltage level of the parallel feedback pin 236. For example, as described in the description associated with FIG. 4, the resistor switches 407a, 407b can close, enabling the parallel feedback pin 236 to be directly connected with the delay operational amplifier 408. In some examples, the delay operational amplifier outputs a signal that is useful to regulate the PWM pulse edge timing to reduce the peak switching current differences in between power FETs.

At block 938, the example parallelization controller 130 determines whether to continue monitoring. In response to continuing monitoring, processing transfers to block 902. Conversely, in response to not continuing monitoring, processing terminates.

FIG. 10 is a flowchart representative of example computer readable instructions 1000 that may be executed to implement the parallelization controllers of the example analog circuits 100, 800 represented in FIGS. 1, 2 and 8 for fault monitoring. As in the drawings described above, the computer readable instructions 1000 are described with reference to the die 116 and the parallelization controller 130. However, the same computer readable instructions 900 are equally applicable to any of the dies 114, 116, 118, 120 and/or any of the parallelization controllers 128, 130, 132, 134. With reference to the drawings described above, the computer readable instructions 1000 begin at block 1002 with the example parallelization controller 130 initiating monitoring of fault conditions. In some examples, the fault monitor 220 initiates monitoring of fault conditions. In some examples, the fault monitor 220 begins monitoring voltage levels on the parallel feedback pin 236 to initiate fault monitoring.

At block 1004, the example parallelization controller 130 determines whether a fault signal has been detected from a parallel die. In some examples, the fault monitor 220 determines whether a fault signal has been detected from another parallel die (e.g., the die 120). In some examples, the fault monitor 220 determines whether a fault signal has been detected by evaluating the voltage level at the parallel feedback pin 236 relative to a threshold, and/or evaluating a rate of change in the voltage level at the parallel feedback pin 236 relative to a threshold. In response to detecting a fault signal from a parallel die, processing transfers to block 1010. Conversely, in response to not detecting a fault signal from a parallel die, processing transfers to block 1006.

At block 1006, the example parallelization controller 130 determines whether a fault condition has been detected on the die 116. In some examples, the fault indicator 228 determines whether a fault condition has been detected on the die 116. For example, the fault indicator 228 can detect an undervoltage condition, overcurrent condition, overtemperature condition, and/or any other fault condition on the die 116. In response to detecting a fault condition on the die 116, processing transfers to block 1008. Conversely, in response to not detecting a fault condition on the die 116, processing transfers to block 1014.

At block 1008, the example parallelization controller 130 connects the parallel feedback pin 236 associated with the die 116 to a low signal. In some examples, the fault indicator 228 connects the die 116 to a low signal. For example, in response to detecting the fault condition, the second indicator switch 804b illustrated in FIG. 8 can be closed, causing the parallel feedback pin 236 to be directly coupled with a low signal (e.g., the first local circuit ground 119a).

At block 1010, the example parallelization controller 130 turns off the transistor 105 on the die 116. For example, the parallelization controller 130 may cause a high impedance to be connected at a terminal of the transistor 105, thereby preventing or reducing current flow through the transistor 105. In some examples, the fault monitor 220 causes the transistor 105 to be turned off in response to detecting the fault condition on the die 116 and/or on a parallel die.

At block 1012, the example parallelization controller 130 determines whether the fault condition has been corrected. For example, if the fault condition was on a parallel die, the fault monitor 220 determines whether the fault condition has been corrected on the parallel die. In some examples, if the fault condition was on the die 116, the fault indicator 228 determines whether the fault condition has been corrected. In some examples, if the fault condition was on a parallel die, the fault monitor 220 can determine the fault condition has been corrected when the voltage at the parallel feedback pin 236 no longer indicates the parallel die is connected to the low signal. In response to the fault condition having been corrected, processing transfers to block 1014. Conversely, in response to the fault condition not having been corrected, processing remains at block 1012.

At block 1014, the example parallelization controller 130 disconnects an affected die from the low signal (in the case that the fault signal was detected on the die, at block 1006) and/or turns on the transistor 105 on the die 116. If the fault was on a parallel die, the affected die may have already been disconnected from the low signal, because this change would be detected by the fault monitor 220 and this change would be used for the fault monitor 220 to determine the fault condition was corrected at block 1012. However, if the fault was on the die 116, in response to determining the fault condition has been corrected, the second indicator switch 804b can open, disconnecting the parallel feedback pin 236 associated with the die 116 from the first local circuit ground 119a. In some examples, to turn on the transistor 105 on the die 116, a high impedance is disconnected, allowing current to flow through the transistor 105.

At block 1016, the example parallelization controller 130 determines whether an excess frequency signal has been detected from a parallel die. In some examples, the fault indicator 228 determines whether the excess frequency condition has been detected on a parallel die (e.g., the die 120). In some examples, the fault indicator 228 can determine whether the excess frequency condition is detected when analyzing whether a fault condition is detected on the parallel die during the procedure described in connection with block 1004. In response to detecting an excess frequency condition on the parallel die, processing transfers to block 1022. Conversely, in response to not detecting an excess frequency condition on the parallel die, processing transfers to block 1018.

At block 1018, the example parallelization controller 130 determines whether an excess frequency condition has been detected on the die 116. In some examples, the fault indicator 228 determines whether the excess frequency condition has been detected on the die 116. In response to the excess frequency condition being detected on the die 116, processing transfers to block 1020. Conversely, in response to the excess frequency condition not being detected on the die 116, processing transfers to block 1028.

At block 1020, the example parallelization controller 130 connects the die 116 to a high signal. For example, in response to detecting the excess frequency condition, the first indicator switch 804a illustrated in FIG. 8 can be closed, causing the parallel feedback pin 236 to be directly coupled to a high signal (e.g., the analog supply source 806).

At block 1022, the example parallelization controller 130 disables the edge delay controller 174 on the die 116. With the edge delay controller 174 disabled, the parallel transistors (e.g., transistors 105, 111) operate in response directly to a PWM pulse, rather than being modulated for parallel operation. In some examples, the parallelization controller 130 disables parallelization to avoid conditions where one transistor takes too much current to compensate for a fault condition on another die (which may potentially result in additional faults). At block 1024, the example parallelization controller 130 determines whether the excessive frequency condition has been corrected. In some examples, the fault indicator 228 determines whether the excessive frequency condition has been corrected if the condition was detected on the die 116. In some examples, the fault monitor 220 determines whether the excessive frequency condition has been corrected based on a signal on the parallel feedback pin 236. For example, if the fault monitor 220 sees that the voltage on the parallel feedback pin connected to a parallel die changes from a high value to a nominal value (such as is reduced by 5V, is reduced by 10V, etc.), it may determine the excessive frequency condition has been corrected on the parallel die. In response to the excessive frequency condition being corrected, processing transfers to block 1026. Conversely, in response to the excessive frequency condition not being corrected, processing remains at block 1024.

At block 1026, the example parallelization controller 130 disconnects the affected die (the die which previously experienced the excessive frequency condition) from the high signal and/or re-enables the edge delay controller on the die 116. In some examples, if the die 116 previously experienced the excessive frequency condition, in response to the fault indicator 228 determining the excessive frequency condition has been corrected, the indicator switch 804a can be opened, disconnecting the parallel feedback pin 236 from the analog supply source 806. In some such examples, the edge delay controller 174 can additionally be re-enabled in response to the fault indicator 228 determining the excessive frequency condition has been corrected. In some examples, if a parallel die experienced the excessive frequency condition, in response to the fault monitor 220 determining the fault condition has been corrected on the parallel die, the edge delay controller 174 can be re-enabled. In some examples, the edge delay controller 174 is re-enabled to allow adjustment of the timing of the PWM signal on the die 116, and improve parallel transistor performance (e.g., reduce voltage ringing during switching).

At block 1028 the example parallelization controller 130 determines whether to continue monitoring. In response to continuing monitoring, processing transfers to block 1002. Conversely, in response to not continuing monitoring, processing terminates.

Figure 11A:
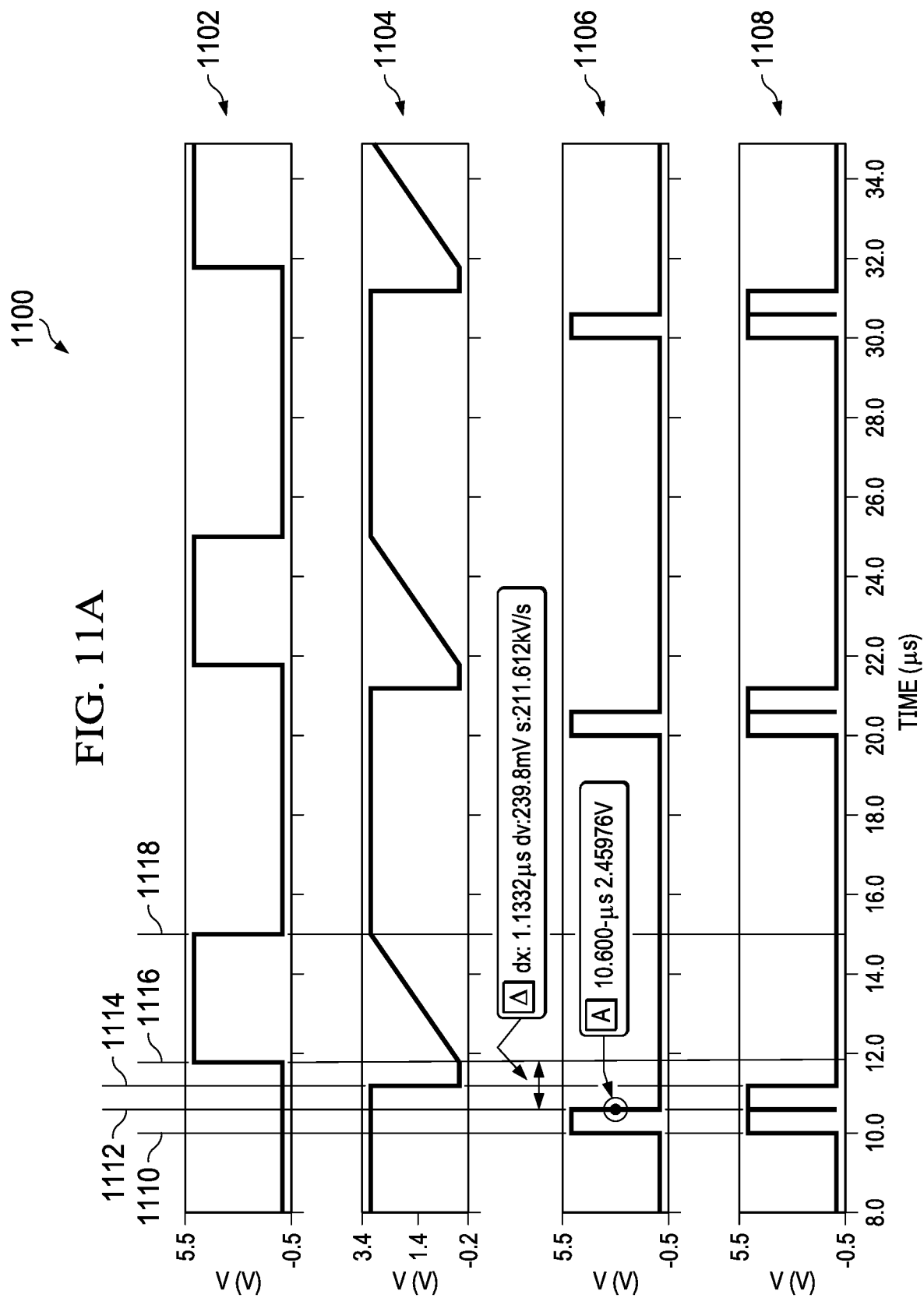

FIGS. 11A-11B are example signal diagrams 1100, 1120 corresponding to example signals observed on the analog circuits 100, 300, 800 of FIGS. 1-8. The example first signal diagram 1100 and the example second signal diagram 1120 each include an example sampling timeseries 1102, an example timer timeseries 1104, an example PWM timeseries 1106, and an example blanking timeseries 1108. The example sampling timeseries 1102 displays a low value (e.g., 0V) when sampling is not occurring, and a high value (e.g., 5V) when sampling occurs. The example timer timeseries 1104 displays a high value when the timer is not active and a value less than the high value (e.g., between 0V and 5V) when the timer is active. For example, the timer may be active during a sampling period to indicate when the sampling should begin and when the sampling should end. The example PWM timeseries 1106 displays the PWM signal that is input to a die (e.g., the PWM signal controls the transistor via the control contact 307). The example blanking timeseries 1108 displays a high value when the blanking period is in place (e.g., when sampling is not allowed) and a low value at other times.

At an example first time 1110 in the first signal diagram 1100 of FIG. 11A, the PWM signal changes from a low value to a high value, as illustrated in the PWM timeseries 1106. When this PWM signal change occurs, the timing controller 244 initiates a blanking period to prevent sampling. Thus, the blanking signal in the example blanking timeseries 1108 changes to high.

At an example second time 1112 in the first signal diagram 1100 of FIG. 11A, the PWM signal changes from a high value to a low value. As a result, the timing controller 244 restarts the blanking period to prevent sampling for a time period following the PWM signal change.

At an example third time 1114 in the first signal diagram 1100 of FIG. 11A, the blanking period expires, and the blanking signal illustrated in the blanking timeseries 1108 changes from a high value to a low value. At an example fourth time 1116, sampling begins (e.g., in response to the conclusion of the blanking period), as illustrated by the change from a low signal to a high signal in the sampling timeseries 1102. At the example third time 1114, the timing controller 244 uses a countdown timer to slowly adjust its signal from the low value to the high value.

At the example fifth time 1118 in the first signal diagram 1100 of FIG. 11A, the timer value illustrated in the timer timeseries 1104 reaches the high value, resulting in the end of the sampling period, as illustrated in the sampling timeseries 1102. In the first signal diagram 1100, the parallelization controller 130 can complete the sampling while the PWM signal is low. In some examples, the parallelization controller 130 may preferentially complete sampling while the PWM signal is low as much as possible, because sampling while PWM is off eliminates the mismatch issues stemming from the local ground wiring resistance mismatches. In some examples, the parallelization controller 130 can preferentially complete sampling while the PWM signal is high (or that can be the only possibility depending on the PWM pulse duty cycle).

In some examples, when the pulse width is not long enough to complete sampling during a specified period (e.g., during the high period), the parallelization controller 130 can complete sampling on the alternate value following a blanking period. One such example of this technique is illustrated in the second signal diagram 1120 of FIG. 11B.

At an example sixth time 1122 in the second signal diagram 1120, the PWM signal changes from low to high, initiating a blanking period.

At an example seventh time 1124 in the second signal diagram 1120, the blanking period concludes.

At an example eighth time 1126 in the second signal diagram 1120 shortly after the sixth time 1124, sampling begins, and a corresponding timer begins to track the amount of sampling time that has elapsed. In this example, sampling preferentially begins on the high signal.

At an example ninth time 1128 in the second signal diagram 1120, the PWM signal changes from high to low. As a result, the sampling timer no longer decreases, and sampling stops. At the example ninth time 1128, a new blanking period begins.

At an example tenth time 1130 in the second signal diagram 1120, the blanking period ends.

At an example eleventh time 1132 in the second signal diagram 1120, shortly after the ninth time 1128, sampling resumes and the sampling timer begins to track the amount of sampling time that has elapsed (by continuing to increase towards the high value).

At an example twelfth time 1134 in the second signal diagram 1120, the sampling timer arrives at the high value, and sampling concludes. Thus, in the illustrated example of FIG. 11B, sampling is partially completed during the PWM high signal, and partially completed during the PWM low signal.

Figure 12:
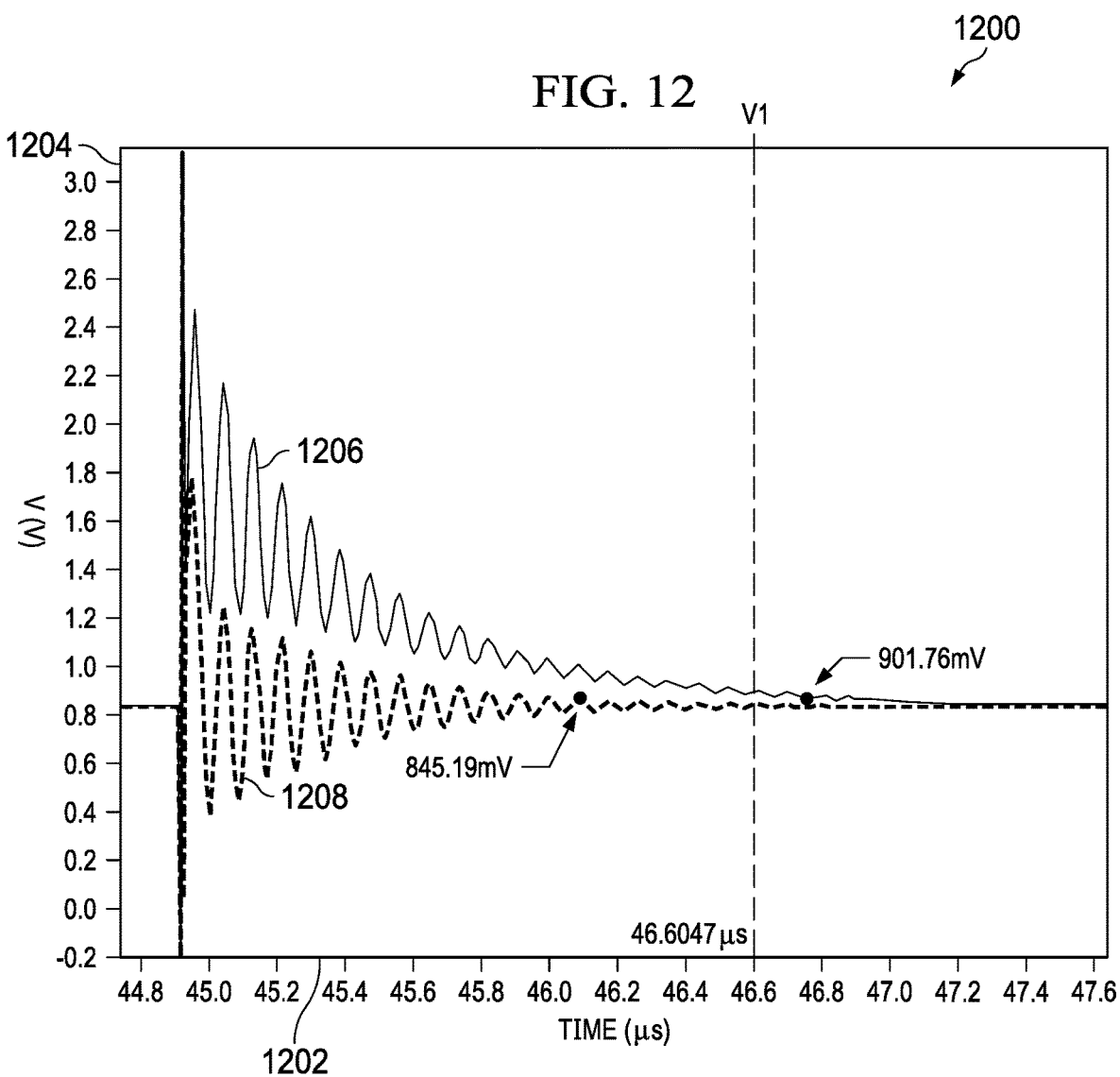
FIG. 12 is an example signal diagram illustrating a reduction in offset signal ringing and the effect of signals settling faster on a die with parallelized transistors in an analog circuit as described herein.

FIG. 12 is an example signal diagram 1200 illustrating faster settling of voltages to final values, and/or a reduction in offset signal ringing on a die with parallelized transistors in an analog circuit as a result of implementation of the teachings described herein. The example signal diagram 1200 includes an example time axis 1202 and an example voltage axis 1204. The example signal diagram 1200 includes an example first signal 1206 illustrating a parallel transistor implementation without using the parallelization controller 130 and the active drive techniques described herein. The example signal diagram 1200 further includes an example second signal 1208 illustrating a reduction in the offset of the voltage values, as well as a reduction in the settling time of the voltage signal following a switching event. When the switching event occurs (at approximately 44.9 μs in the signal diagram 1200), both the first signal 1206 and the second signal 1208 experience large voltage fluctuations. However, with the active drive techniques described herein (such as the average current active drive implementation illustrated in FIGS. 4 and 5, the follow-the-leader active drive implementation illustrated in FIGS. 6 and 7, the active drive controller 182 of FIGS. 1 and 2, etc.), the second signal 1208 quickly stabilizes around the correct final voltage value (approximately 0.8V in the illustrated example of FIG. 12).

Figure 13:
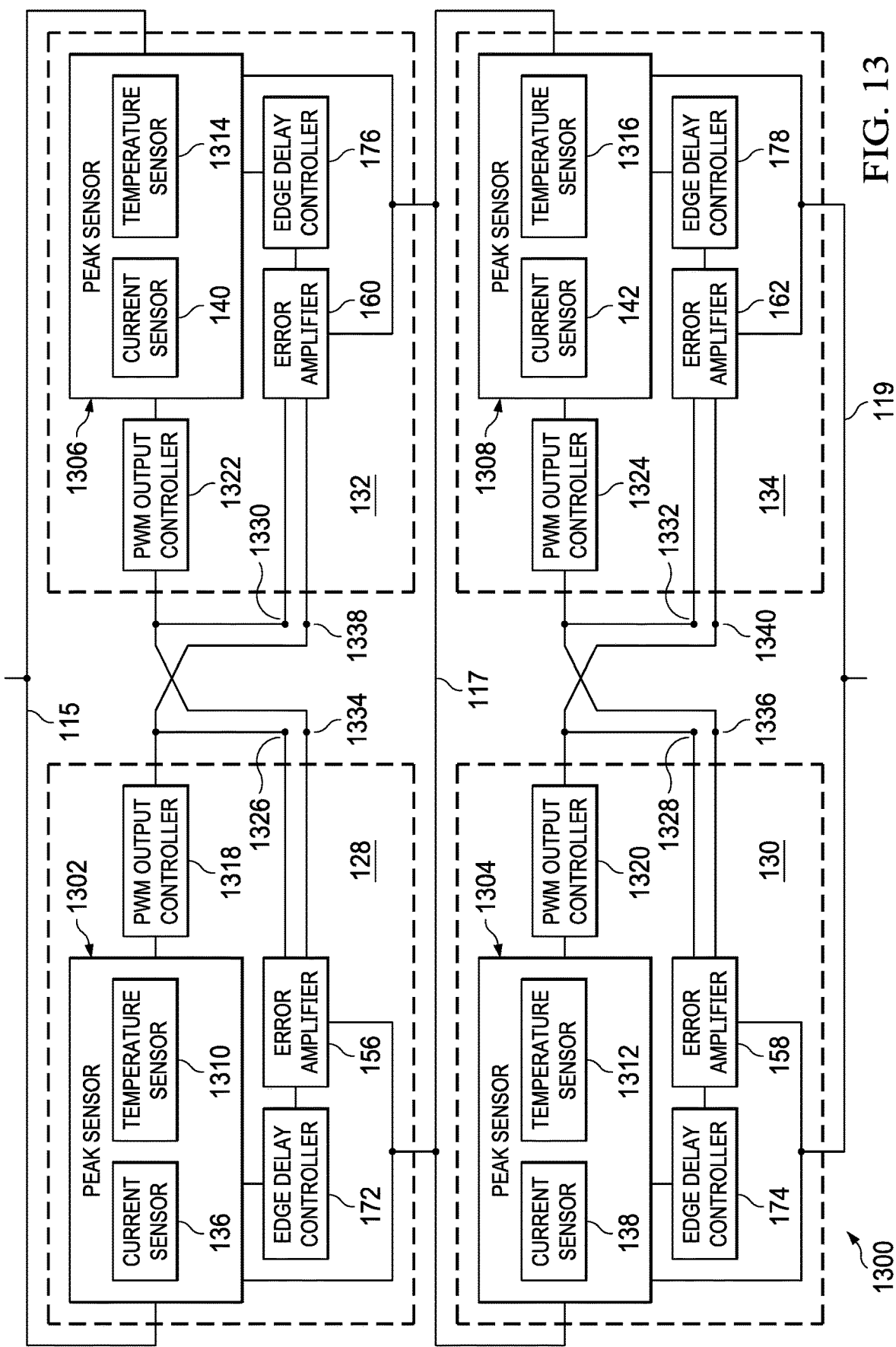
FIG. 13 is an example block diagram illustrating an example implementation of an example digital circuit to implement parallelized transistors.

FIG. 13 is an example block diagram 1300 illustrating an example implementation of an example use of digital communication to implement parallelized transistors in accordance with the teachings of this description. The example block diagram 1300 includes the parallelization controllers 128, 130, 132, 134. The example parallelization controllers 128, 130, 132, 134 include example peak sensors 1302, 1304, 1306, 1308. The example peak sensors 1302, 1304, 1306, 1308 include the example current sensors 136, 138, 140 142 and/or example temperature sensors 1310, 1312, 1314, 1316. The example parallelization controllers 128, 130, 132, 134 further include the example edge delay controllers 172, 174, 176, 178, the example error amplifiers 156, 158, 160, 162, and example PWM output controllers 1318, 1320, 1322, 1324. The block diagram 1300 further includes example first parallel feedback pins 1326, 1328, 1330, 1332 and example second parallel feedback pins 1334, 1336, 1338, 1340. As in the description above, the following description refers specifically to the parallelization controller 130 and components included therein (such as the peak sensor 1304, temperature sensor 1312, PWM output controller 1320, etc.). However, such description applies equally to any one of the parallelization controllers 128, 130, 132, 134 and/or any components included therein (such as peak sensors 1302, 1304, 1306, 1308, temperature sensors 1310, 1312, 1314, 1316, PWM output controllers 1318, 1320, 1322, 1324, etc.). The peak sensors 1302, 1304, 1306, 1308 of the illustrated example of FIG. 13 may include any combination of the current sensors 136, 138, 140, 142 and/or the temperature sensors 1310, 1312, 1314, 1316. For example, some implementations may use both the current sensors 136, 138, 140, 142 and the temperature sensors 1310, 1312, 1314, 1316, while other examples may use one or the other.

The example peak sensor 1304 of the illustrated example of FIG. 13 determines a voltage value representative of a peak current value through the transistor 105 on the die 116 and/or a temperature value on the die 116. In some examples, the peak sensor 1304 uses the current sensor 136 to generate a voltage proportional to a peak current through the transistor 105. In some examples, the temperature sensor 1312 monitors temperature levels on the die 116 and generates a voltage proportional to the temperature level (such as an instantaneous temperature level, a peak temperature level, etc.). The peak sensor 1304 of the illustrated example of FIG. 13 communicates the voltage output to the PWM output controller 1320.

The example temperature sensor 1312 of the illustrated example of FIG. 13 outputs a voltage proportional to a temperature value on the die 116. Temperature is useful to help modulate PWM edge timing for parallel dies, because changes in temperature on the die 116 can be correlated with differences in the amount of current flowing through parallel dies. For example, if the die 116 switches before the die 118, it may briefly experience a strong current surge, which can result in the temperature of the die 116 increasing. Further detail of the implementation of the temperature sensor 1312 is illustrated and described in association with FIG. 16.

The example PWM output controller 1320 of the illustrated example of FIG. 13 outputs a PWM signal whose duty cycle is proportional to the voltage provided by the peak sensor 1304. In the digital bus implementation, no passive drive phase or active drive phase exists, because sampling does not occur. Instead, the PWM output controller 1320 continually outputs a PWM signal that represents a peak current and/or a temperature value on the die 116. In some examples, the PWM output controller 1320 compares the voltage output from the peak sensor 1304 with a triangular waveform (e.g., a sawtooth waveform). In some such examples, the PWM output controller 1320 outputs a PWM signal with a duty cycle that is proportional to the voltage output from the peak sensor 1304. The example PWM output controller 1320 outputs the PWM signal to the first parallel feedback pin 1328 associated with the die 116 and to the second parallel feedback pin 1340 associated with the die 120.

The example first parallel feedback pin 1328 of the illustrated example of FIG. 13 accesses the output of the PWM output controller 1320 from the die 116, enabling the error amplifier 158 to receive a signal that is based on the voltage output of the peak sensor 1304 of the die 116. The example second parallel feedback pin 1336 of the illustrated example of FIG. 13 accesses the output of the PWM controller 1324 from the die 120, enabling the error amplifier 158 to receive a signal that is based on the voltage output of the peak sensor 1308 of the die 120. Thus, the error amplifier 158 has access to information corresponding to its own die (the die 116) and a parallel die (the die 120). In the digital bus implementation illustrated in FIG. 13, the error amplifier 158 and/or the edge delay controller 174 can use continuous time filtering to compare voltages representing peak current values and/or voltages representing temperature values to adjust and synchronize PWM signals (e.g., via the edge delay controller 174). Thus, in the digital implementation illustrated in the block diagram of FIG. 13, both dies use two parallel feedback pins respectively to gain access to a PWM signal associated with their own information (e.g., their own peak current and/or temperature) as well as information associated with another die (e.g., a parallel die's peak current and/or temperature). In this way, the edge delay controllers 174, 178 on each die can adjust to better synchronize timing of switching events and reduce differences in peak current and/or temperature resulting from unequal switching times. In some examples, the digital bus illustrated in FIG. 13 is a PWM type bus or a sigma-delta type bus. In some examples, when more than two dies are in parallel, each die reports its information to one other die, and receives information from one other die. For example, in an implementation with three parallel dies, the first can report its signal representing its own die information (such as peak current, die temperature, etc.) to the second die, the second die can report its information to the third die, and the third die can report its information to the first die to achieve paralleling.

While an example manner of implementing the parallelization controllers 128, 130, 132, 134 is illustrated in FIG. 13, one or more of the elements, processes and/or devices illustrated in FIG. 13 may be combined, divided, rearranged, omitted, eliminated and/or implemented in any other way. Further, the example peak sensors 1302, 1304, 1306, 1308, the example current sensors 136, 138, 140, 142, the example temperature sensors 1310, 1312, 1314, 1316, the example edge delay controllers 172, 174, 176, 178, the example error amplifiers 156, 158, 160, 162, the example PWM output controllers 1318, 1320, 1322, 1324 and/or, more generally, the example parallelization controllers 128, 130, 132, 134 of FIG. 13 may be implemented by hardware, software, firmware and/or any combination of hardware, software and/or firmware. Thus, for example, any of the example peak sensors 1302, 1304, 1306, 1308, the example current sensors 136, 138, 140, 142, the example temperature sensors 1310, 1312, 1314, 1316, the example edge delay controllers 172, 174, 176, 178, the example error amplifiers 156, 158, 160, 162, the example PWM output controllers 1318, 1320, 1322, 1324 and/or, more generally, the example parallelization controllers 128, 130, 132, 134 of FIG. 13 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). At least one of the example peak sensors 1302, 1304, 1306, 1308, the example current sensors 136, 138, 140, 142, the example temperature sensors 1310, 1312, 1314, 1316, the example edge delay controllers 172, 174, 176, 178, the example error amplifiers 156, 158, 160, 162, the example PWM output controllers 1318, 1320, 1322, 1324 is/are hereby expressly defined to include a non-transitory computer readable storage device or storage disk such as a memory, a digital versatile disk (DVD), a compact disk (CD), a Blu-ray disk, etc. including the software and/or firmware. Further still, the example parallelization controllers 128, 130, 132, 134 of FIG. 13 may include one or more elements, processes and/or devices in addition to, or instead of, those illustrated in FIG. 13, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 14:
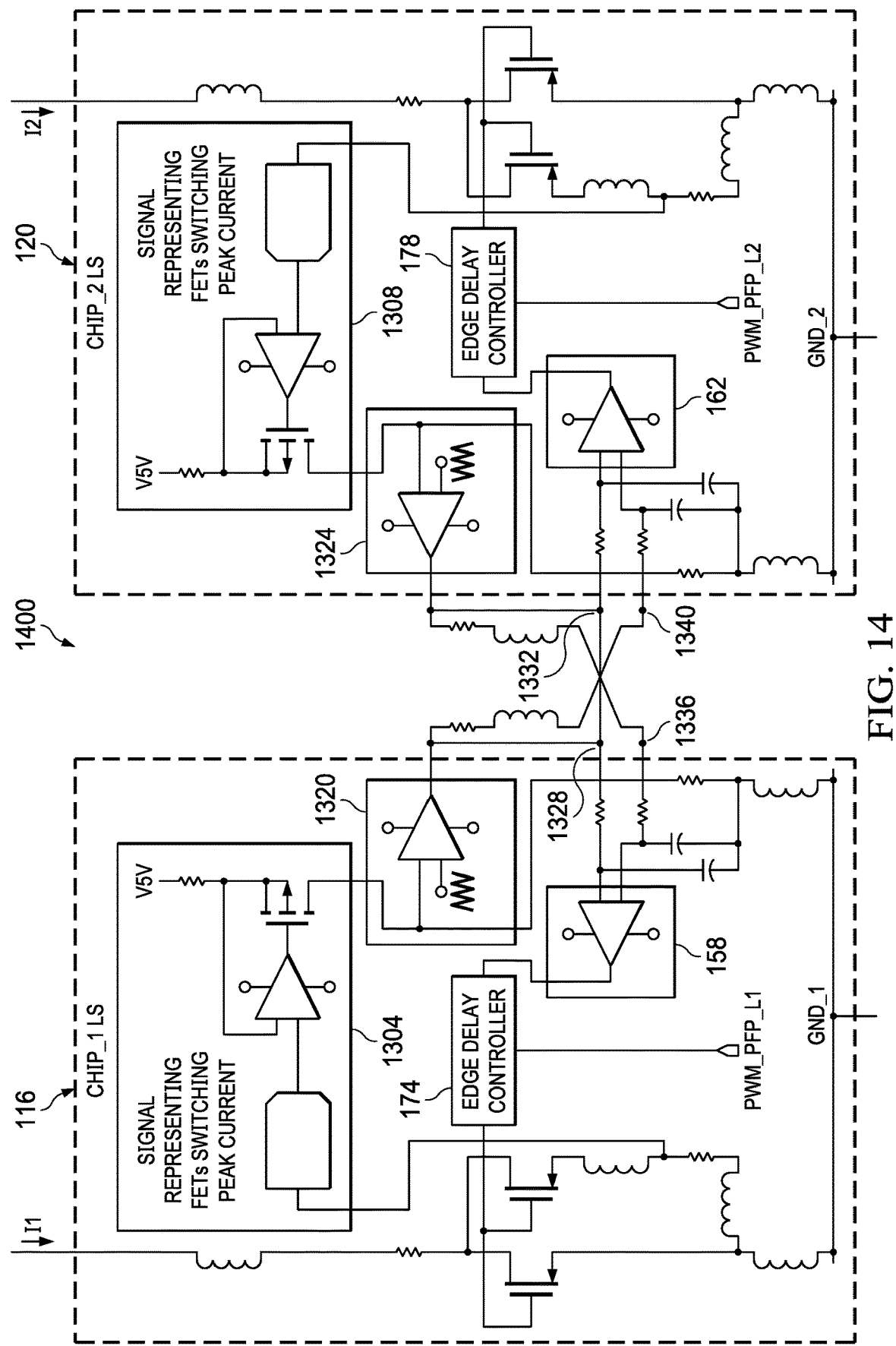
FIG. 14 is an illustration of an example digital circuit to implement parallelized transistors based on the block diagram of FIG. 13.

FIG. 14 is an illustration of an example digital circuit 1400 to implement parallelized transistors based on the block diagram 1300 of FIG. 13. The digital circuit 1400 includes the example error amplifiers 158, 162, the example edge delay controllers 174, 178, the example peak sensors 1304, 1308, the example PWM output controllers 1320, 1324, the example first parallel feedback pins 1328, 1332, and the example second parallel feedback pins 1336, 1340.

As described in connection with FIG. 13, the peak sensors 1304, 1308 determine a voltage proportional to a peak current and/or temperature value on their respective dies 116, 120. The peak sensors 1304, 1308 may include the example current sensors 138, 142 and/or the example temperature sensors 1312, 1316. In some examples wherein the peak sensors 1304, 1308 include the current sensors 138, 142, the structure of the current sensors 138, 142 is illustrated and described in connection with FIGS. 2 and 3. The structure and operation of the temperature sensors 1312, 1316 is further illustrated and described in connection with FIG. 16.

In the illustrated example of FIG. 14, the PWM output controllers 1320, 1324 are comparators. The example PWM output controllers 1320, 1324 of FIG. 14 receive at a first input (e.g., the top input as viewed on the page in FIG. 14) the peak current and/or temperature value from the peak sensors 1304, 1308. The example PWM output controllers 1320, 1324 of FIG. 14 receive at a second input (e.g., the bottom input as viewed on the page in FIG. 14) a PWM ramp signal. For example, the PWM ramp signal may be a sawtooth function (e.g., triangular waveform) with a consistent specified frequency. The example PWM output controllers 1320, 1324 output a PWM signal whose duty cycle is proportional to the voltage received at the first input (the voltage corresponding to peak current and/or temperature information on the dies 116, 120). As illustrated in the digital circuit 1400, the output of the PWM output controllers 1320, 1324 are each provided to two parallel feedback pins. The output of the PWM output controller 1320 is provided to the first parallel feedback pin 1328 of the die 116, as well as the second parallel feedback pin 1340 of the die 120. Similarly, the output of the example PWM output controller 1324 is provided to the first parallel feedback pin 1332 of the die 120, as well as the second parallel feedback pin 1336 of the die 116. In some examples, as illustrated in FIG. 14, the output which is provided to a parallel die passes through a resistor and/or an inductor (e.g., the inductor representing parasitic trace inductance in between paralleled dies) before being received at the parallel die's second parallel feedback pin 1336, 1340.

The example error amplifiers 158, 162 of the illustrated example of FIG. 14 each receive the output PWM signals from their own PWM output controllers 1320, 1324, as well as an output based on their respective parallel PWM output controllers 1320, 1324. The example error amplifiers 158, 162 compare the values corresponding to their respective dies with the value from the parallel die and output a signal corresponding to the difference between these signals. The example error amplifier 158 communicates this output signal to the edge delay controller 174, and the example error amplifier 162 communicates the output signal to the edge delay controller 178. The example edge delay controllers 174, 178 adjust the timing of PWM signals that are received at the control contact 307 of the transistors 105, 111.

Figure 15:
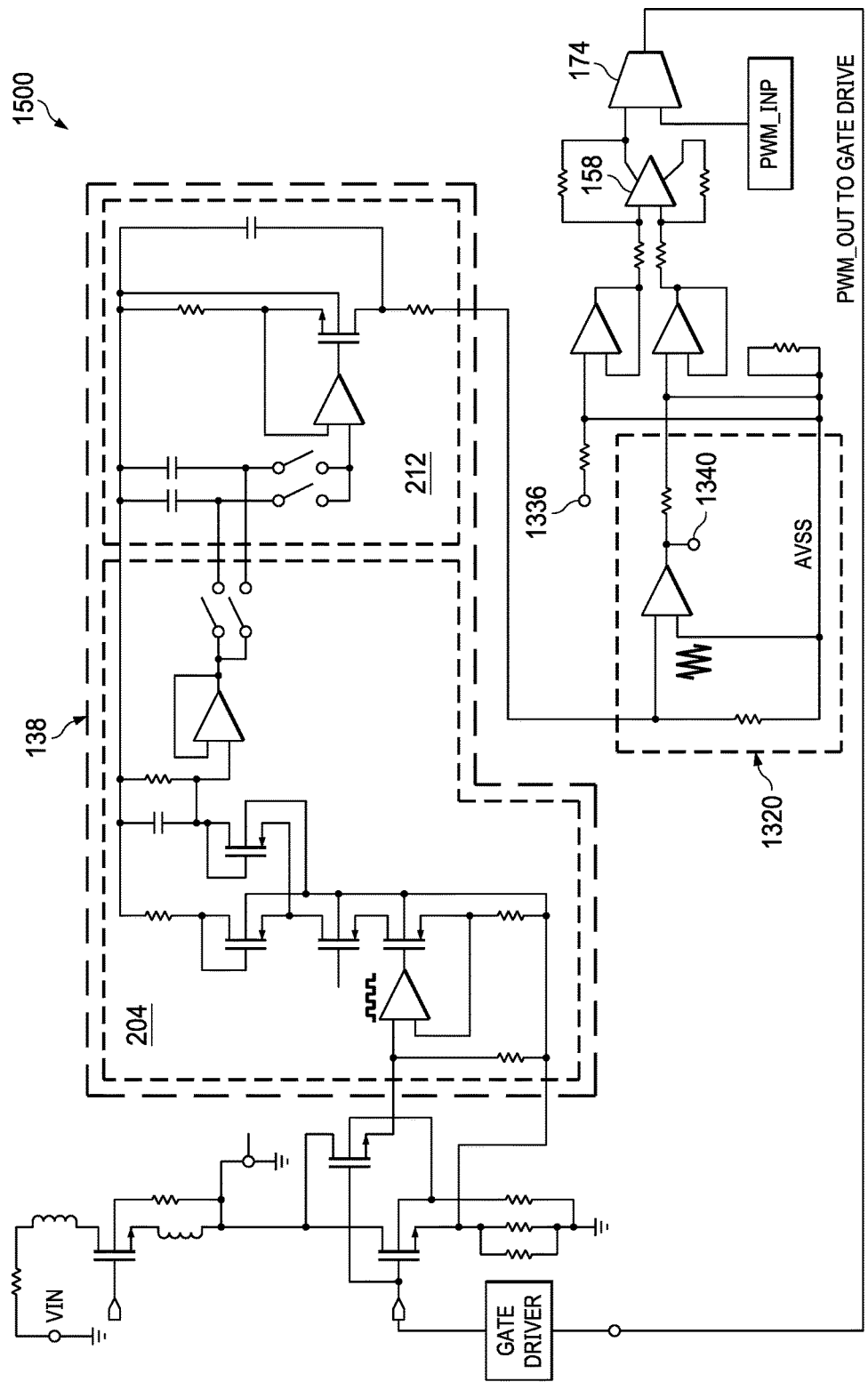
FIG. 15 is an illustration of an example digital circuit to implement the parallelized transistors using a digital communication bus based on an example peak current sensing technique.

FIG. 15 is an illustration of an example digital circuit 1500 to implement the parallelized transistors using a digital communication bus based on an example peak current sensing technique. The example digital circuit 1500 includes the example current sensor 138, the example peak current to voltage converter 204, the example chip voltage to current converter 212, the example error amplifier 158, and the example edge delay controller 174 of FIG. 3. The example digital circuit 1500 further includes the example PWM output controller 1320, the example second parallel feedback pins 1336, 1340. As described above in connection with FIG. 14, the example PWM output controller 1420 includes a comparator. The example comparator of the PWM output controller 1320 receives a signal corresponding to a peak current value on the die 116 at a first input, and a PWM ramp signal at a second output. The comparator outputs a PWM signal proportional to the peak current value observed by the current sensor 138. The PWM output controller 1320 of the illustrated example communicates the PWM output signal to the example error amplifier 158 and/or the example edge delay controller 174, as well as to a parallel die. In the illustrated example, the output of the comparator of the PWM output controller 1320 is coupled to the second parallel feedback pin 1340 of the die 120.

Figure 16:
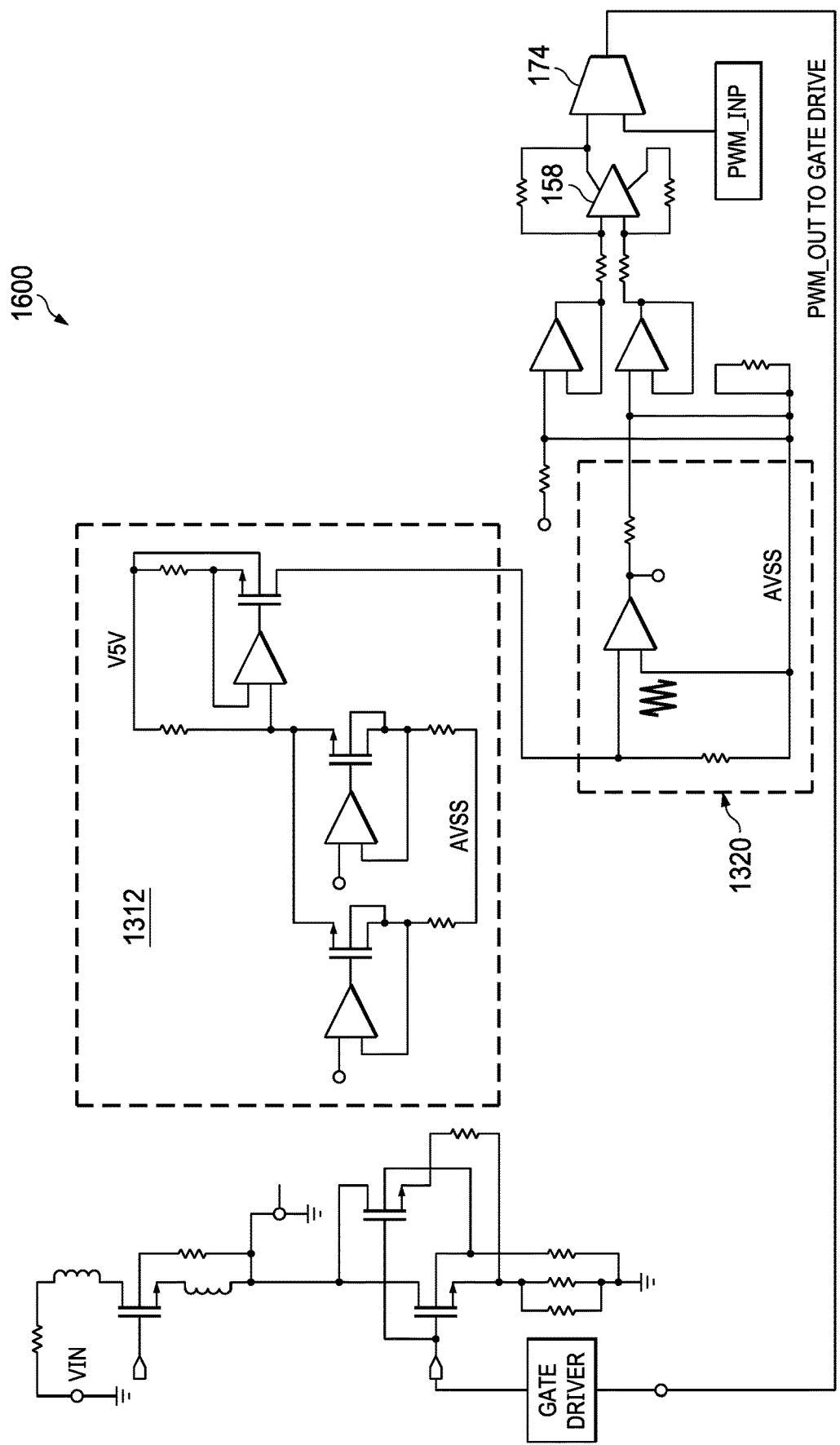
FIG. 16 is an illustration of an example digital circuit to implement the parallelized transistors based on an example temperature sensing technique.

FIG. 16 is an illustration of an example digital circuit 1600 to implement the parallelized transistors based on an example temperature sensing technique. The example digital circuit 1600 includes the example error amplifier 158, the example edge delay controller 174, the example temperature sensor 1312, and the example PWM output controller 1320. The example temperature sensor 1312 of the illustrated example of FIG. 16 determines a temperature value on the die 116. The example temperature sensor 1312 outputs a voltage value proportional to the temperature value on the die 116 and communicates this voltage to the example error amplifier 158 and/or the example edge delay controller 174.

Figure 17:
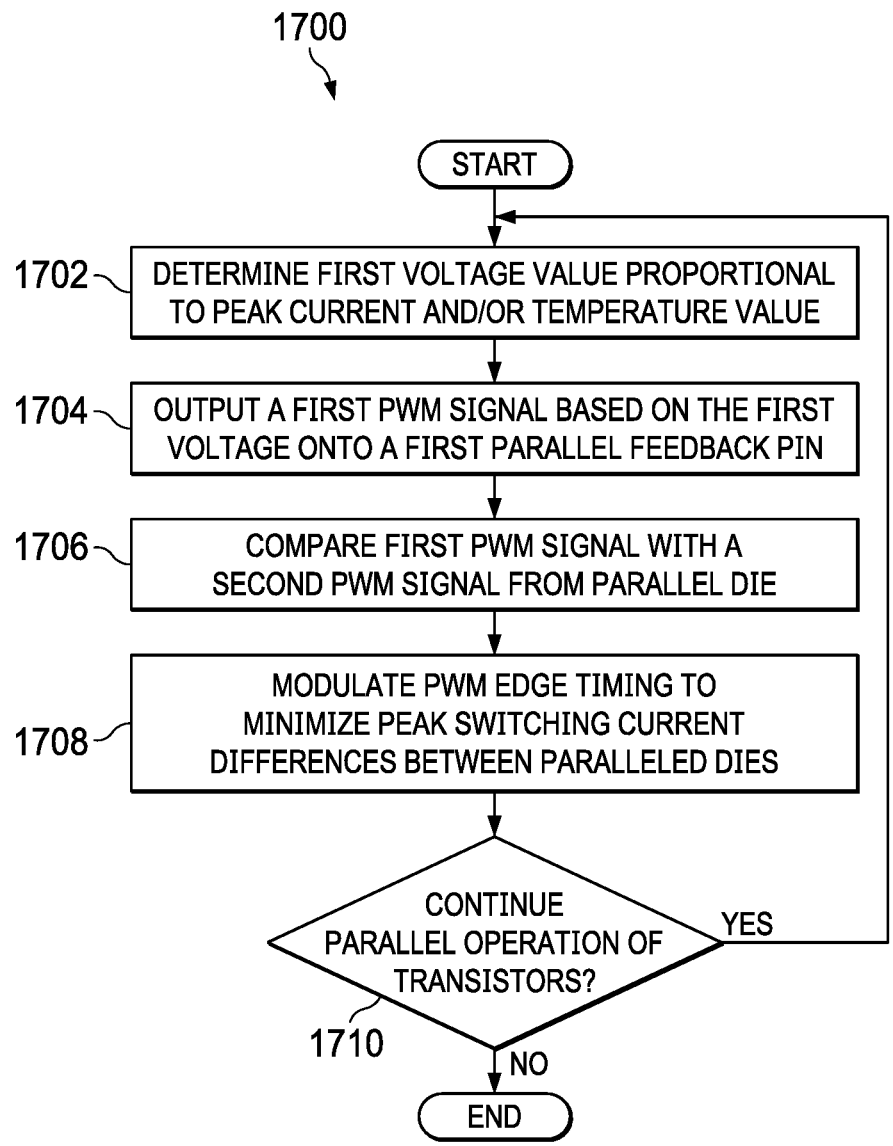
FIG. 17 is a flowchart representative of example computer readable instructions that may be executed to implement the parallelization controller of FIG. 13 and the example digital circuits of FIGS. 14-16.

A flowchart representative of example hardware logic, machine readable instructions, hardware implemented state machines, and/or any combination thereof for implementing the parallelization controller 130 (and/or any of the parallelization controllers 128, 130, 132, 134) of FIG. 13 and the digital circuits 1400, 1500, 1600 of FIGS. 14-16 is shown in FIG. 17. The machine readable instructions may be one or more executable programs or portion(s) of an executable program for execution by a computer processor and/or processor circuitry, such as the processor 2012 shown in the example processor platform 2000 described below in connection with FIG. 20. The program may be embodied in software stored on a non-transitory computer readable storage medium such as a CD-ROM, a floppy disk, a hard drive, a DVD, a Blu-ray disk, or a memory associated with the processor 2012, but the entire program and/or parts thereof could alternatively be executed by a device other than the processor 2012 and/or embodied in firmware or dedicated hardware. Further, although the example program is described with reference to the flowchart illustrated in FIG. 17, many other methods of implementing the example parallelization controller 130 and/or the digital circuits 1400, 1500, 1600 may alternatively be used. For example, the order of execution of the blocks may be changed, and/or some of the blocks described may be changed, eliminated, or combined. Additionally or alternatively, any or all of the blocks may be implemented by one or more hardware circuits (such as discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (such as a multi-core processor in a single machine, multiple processors distributed across a server rack, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (such as portions of instructions, code, representations of code, etc.) useful to create, manufacture, and/or produce machine executable instructions. For example, the machine readable instructions may be fragmented and stored on one or more storage devices and/or computing devices (e.g., servers) located at the same or different locations of a network or collection of networks (such as in the cloud, in edge devices, etc.). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement one or more functions that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc. in order to execute the instructions on a particular computing device or other device. In another example, the machine readable instructions may need to be configured (such as settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As described above, the example processes of FIG. 17 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

FIG. 17 is a flowchart representative of example computer readable instructions 1700 that may be executed to implement the parallelization controller 130 of FIG. 13 and the digital circuits 1400, 1500, 1600 of FIGS. 14-16. As in the drawings described above, the computer readable instructions 1700 are described with reference to the die 116 and the parallelization controller 130. However, the same computer readable instructions 900 are equally applicable to any of the dies 114, 116, 118, 120 and/or any of the parallelization controllers 128, 130, 132, 134. With reference to the drawings described above, the example machine readable instructions 1700 begin at block 1702 with the parallelization controller 130 determining a first voltage value proportional to a peak current and/or temperature value. In some examples, the current sensor 136 of the peak sensor 1402 determines a first voltage value proportional to a peak current through the transistor 105. In some examples, the temperature sensor 1310 determines a first voltage value proportional to a temperature value on the die 116.

At block 1704, the example parallelization controller 130 outputs a first PWM signal based on the first voltage onto a first parallel feedback pin. In some examples, the PWM output controller 1320 compares the first voltage with a sawtooth function (e.g., a triangular waveform) and outputs a PWM signal proportional to the first voltage. For example, the PWM output controller 1320 can output a PWM signal that is communicated onto the first parallel feedback pin 1328 associated with the die 116 and onto the second parallel feedback pin 1340 associated with the die 120.

At block 1706, the example parallelization controller 130 compares the first PWM signal with a second PWM signal from a parallel die. In some examples, the error amplifier 158 compares the first PWM signal (e.g., corresponding to the die's own information) with a second PWM signal (e.g., corresponding to a parallel die's information). For example, the second PWM signal may be a PWM signal output by the PWM output controller 1324 of the die 120. In some examples, the error amplifier 158 communicates the output of the comparison to the edge delay controller 174.

At block 1708, the example parallelization controller 130 modulates the PWM edge timing to minimize peak switching current differences between paralleled dies. In some examples, the edge delay controller 174 modulates the PWM signal that is received at the control contact 307 of the transistor 105 to better synchronize switching with respect to the parallel die 120.

At block 1710, the example parallelization controller 130 determines whether to continue parallel operation of the transistors. In response to continuing parallel operation of the transistors, processing returns to block 1702. Conversely, in response to not continuing parallel operation of the transistors, processing terminates.

Figure 18A:
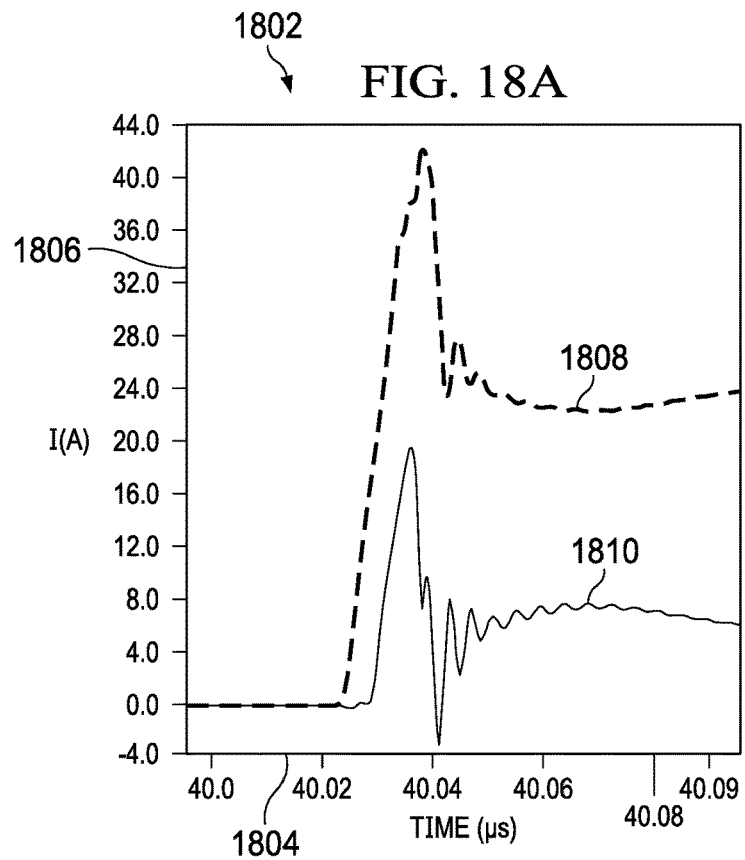
FIGS. 18A-18B illustrate are example signal diagrams illustrating a reduction in peak switching current mismatches between parallel dies in a digital circuit constructed in accordance with techniques described herein.
Figure 18B:
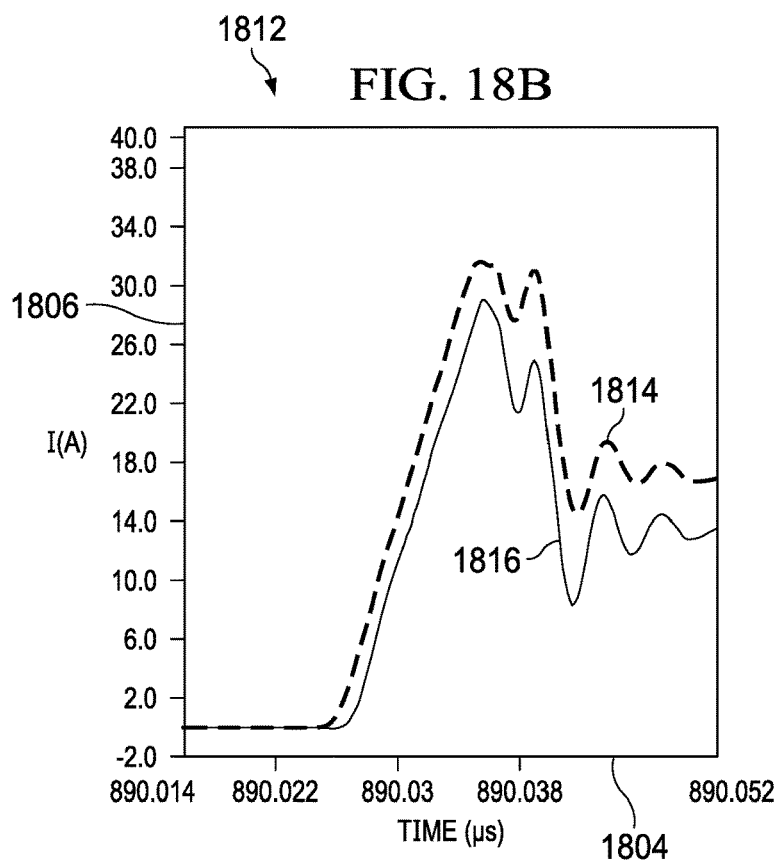

FIGS. 18A-18B illustrate are example signal diagrams illustrating a reduction in peak switching current mismatches between parallel dies in a digital circuit constructed in accordance with techniques described herein. The example signal diagram 1802 of FIG. 18A illustrates current values through parallel transistors in a digital circuit without implementation of the teachings described herein. The example signal diagram 1802 includes a time axis 1804 and a current axis 1806. The example signal diagram 1802 illustrates an example first signal 1808 associated with a first transistor, and an example second signal 1810 associated with a second transistor in parallel with the first transistor. As illustrated, the current value of the first signal 1808 increases rapidly before the current value of the second signal 1810 increases. In such a situation, the temperature values on the dies may raise to undesirable levels due to the large influx of current. Even after the second signal 1810 increases (e.g., due to a PWM signal causing the transistor to switch), a large current disparity remains through the two parallel transistors.

The example signal diagram 1812 of FIG. 18B illustrates the reduction in the current disparity between parallel resistors following a switching event when the techniques described herein are implemented. The example signal diagram 1812 includes an example third signal 1814 associated with a first transistor, and an example fourth signal 1816 associated with a second transistor in parallel with the first transistor. In the example signal diagram 1812 of FIG. 18B, the first transistor again switches before the second transistor (as illustrated by the increase in current occurring first in the third signal 1814 relative to the fourth signal 1816), but the second transistor then switches in a shorter time and the current through the second transistor increases proportionally to the current in the first transistor. In the example signal diagram 1812, the third signal 1814 and the fourth signal 1816 track each other with minimal offset and the deviation in current between the first and the second transistor is minimized. As described above, the PWM output controllers 1318, 1320, 1322, 1324 of the block diagram 1300 enable continual comparison between parallel dies of currents through parallel transistors (represented by information corresponding to peak current, represented by voltage information corresponding to temperature, etc.). The error amplifiers 156, 158, 160, 162 and/or the edge delay controllers 172, 174, 176, 178 use this comparison information to adjust PWM signals through the transistors and reduce current discrepancies between parallel dies. As a result, by implementing the techniques for digital circuit parallelization of transistors as described herein, the difference in currents between parallel transistors during switching events can be minimized, and transistor performance and reliability can be improved.

Figure 19:
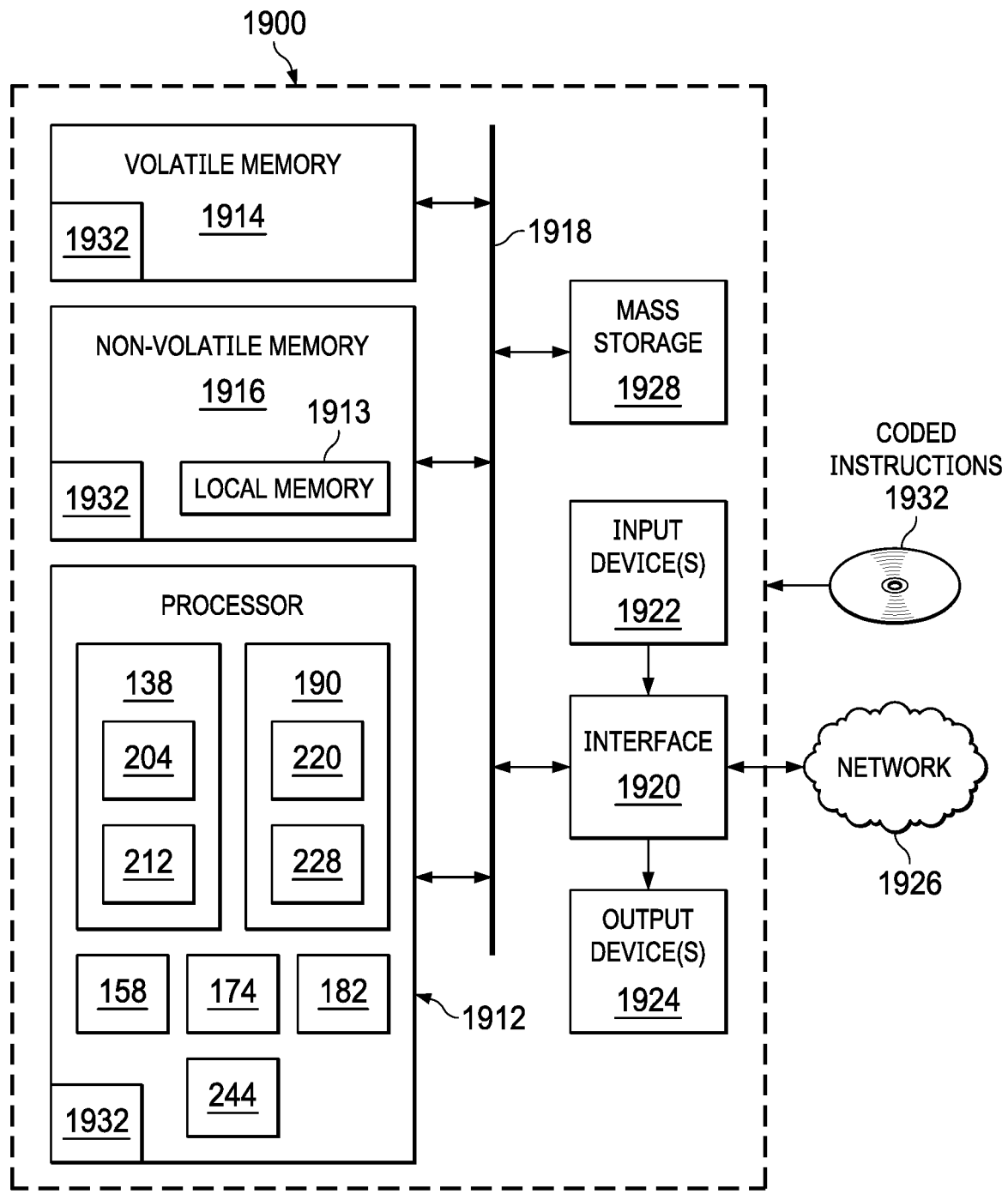
FIG. 19 is a block diagram of an example processor platform structured to execute the example computer readable instructions of FIGS. 9-10 to implement the example parallelization controller of FIGS. 1-2.

FIG. 19 is a block diagram of an example processor platform 1900 structured to execute the instructions of FIGS. 9-10 to implement the parallelization controller 130 (and/or any of the parallelization controllers 128, 130, 132, 134) of FIG. 2. The processor platform 1900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1900 of the illustrated example includes a processor 1912. The processor 1912 of the illustrated example is hardware. For example, the processor 1912 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example current sensor 138, the example peak current to voltage converter 204, the example chip voltage to current converter 212, the example fault monitoring system 190, the example fault monitor 220, the example fault indicator 228, the example error amplifier 158, the example edge delay controller 174, the example active drive controller 182, and the example timing controller 244.

The processor 1912 of the illustrated example includes a local memory 1913 (e.g., a cache). The processor 1912 of the illustrated example is in communication with a main memory including a volatile memory 1914 and a non-volatile memory 1916 via a bus 1918. The volatile memory 1914 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1916 may be implemented by flash memory and/or any other desired type of memory device. Access to the main memory 1914, 1916 is controlled by a memory controller.

The processor platform 1900 of the illustrated example also includes an interface circuit 1920. The interface circuit 1920 may be implemented by any type of interface standard, such as an Ethernet interface, a universal serial bus (USB), a Bluetooth® interface, a near field communication (NFC) interface, and/or a PCI express interface.

In the illustrated example, one or more input devices 1922 are connected to the interface circuit 1920. The input device(s) 1922 permit(s) a user to enter data and/or commands into the processor 1912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1924 are also connected to the interface circuit 1920 of the illustrated example. The output devices 1924 can be implemented, for example, by display devices (such as a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1920 of the illustrated example, thus, includes a graphics driver card, a graphics driver chip and/or a graphics driver processor.

The interface circuit 1920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1900 of the illustrated example also includes one or more mass storage devices 1928 for storing software and/or data. Examples of such mass storage devices 1928 include floppy disk drives, hard drive disks, compact disk drives, Blu-ray disk drives, redundant array of independent disks (RAID) systems, and digital versatile disk (DVD) drives.

The machine executable instructions 900, 1000, 2032 of FIGS. 9-10 may be stored in the mass storage device 1928, in the volatile memory 1914, in the non-volatile memory 1916, and/or on a removable non-transitory computer readable storage medium such as a CD or DVD.

Figure 20:
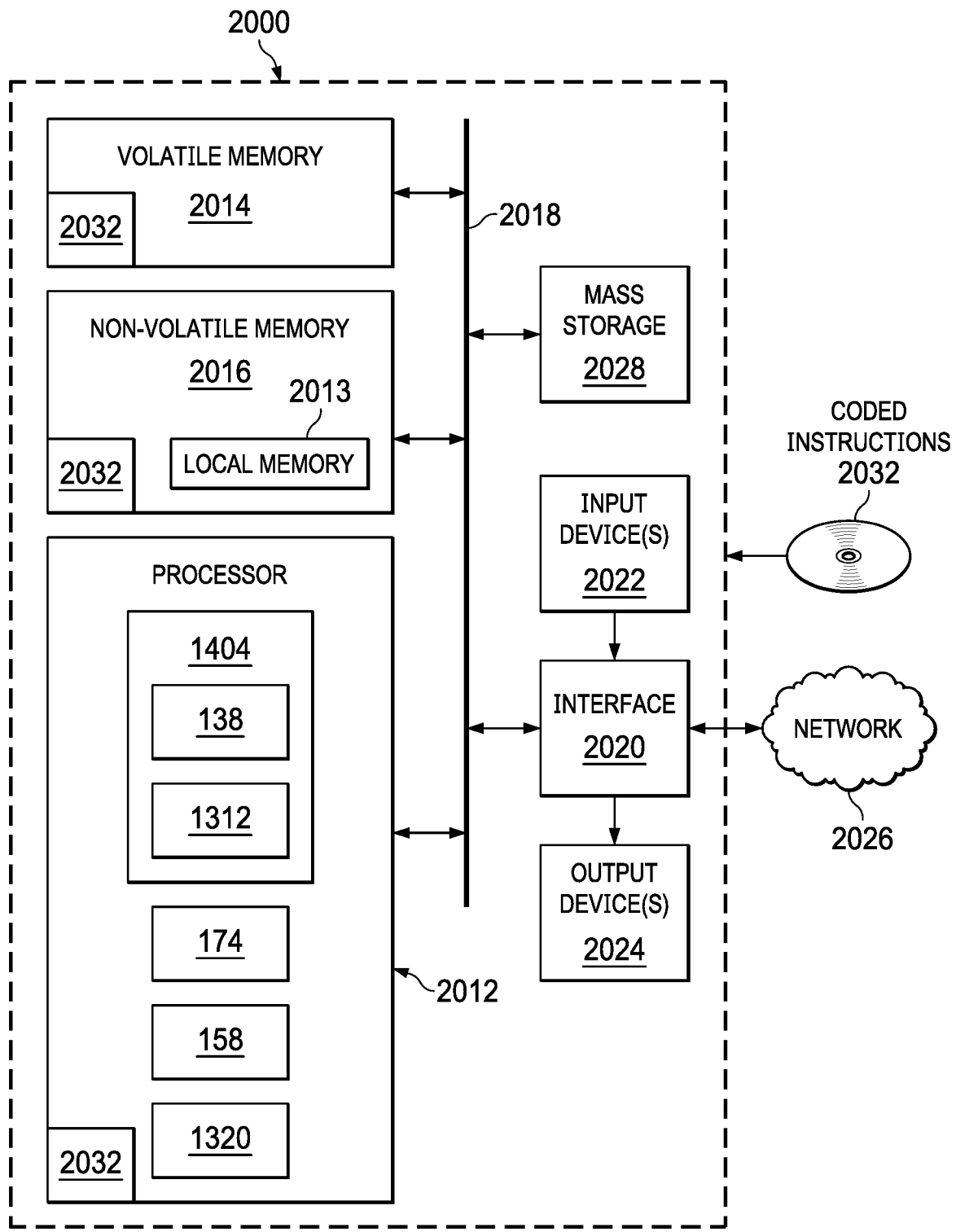
FIG. 20 is a block diagram of an example processor platform structured to execute the example computer readable instructions of FIG. 17 to implement the example parallelization controller of 14-16.

FIG. 20 is a block diagram of an example processor platform 2000 structured to execute the instructions of FIG. 17 to implement the parallelization controller 130 (and/or any of the parallelization controllers 128, 130, 132, 134) of FIG. 13. The processor platform 2000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 2000 of the illustrated example includes a processor 2012. The processor 2012 of the illustrated example is hardware. For example, the processor 2012 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example peak sensor 1304, the example current sensor 138, the example temperature sensor 1312, the example error amplifier 158, the example edge delay controller 174, and the example PWM output controller 1320.

The processor 2012 of the illustrated example includes a local memory 2013 (e.g., a cache). The processor 2012 of the illustrated example is in communication with a main memory including a volatile memory 2014 and a non-volatile memory 2016 via a bus 2018. The volatile memory 2014 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 2016 may be implemented by flash memory and/or any other desired type of memory device. Access to the main memory 2014, 2016 is controlled by a memory controller.

The processor platform 2000 of the illustrated example also includes an interface circuit 2020. The interface circuit 2020 may be implemented by any type of interface standard, such as an Ethernet interface, a universal serial bus (USB), a Bluetooth® interface, a near field communication (NFC) interface, and/or a PCI express interface.

In the illustrated example, one or more input devices 2022 are connected to the interface circuit 2020. The input device(s) 2022 permit(s) a user to enter data and/or commands into the processor 2012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 2024 are also connected to the interface circuit 2020 of the illustrated example. The output devices 2024 can be implemented, for example, by display devices (such as a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 2020 of the illustrated example, thus, includes a graphics driver card, a graphics driver chip and/or a graphics driver processor.

The interface circuit 2020 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 2026. The communication can be via, for example, an Ethernet connection, a digital subscriber line (DSL) connection, a telephone line connection, a coaxial cable system, a satellite system, a line-of-site wireless system, a cellular telephone system, etc.

The processor platform 2000 of the illustrated example also includes one or more mass storage devices 2028 for storing software and/or data. Examples of such mass storage devices 2028 include floppy disk drives, hard drive disks, compact disk drives, Blu-ray disk drives, redundant array of independent disks (RAID) systems, and digital versatile disk (DVD) drives.

The machine executable instructions 1700, 2032 of FIG. 17 may be stored in the mass storage device 2028, in the volatile memory 2014, in the non-volatile memory 2016, and/or on a removable non-transitory computer readable storage medium such as a CD or DVD.

Accordingly, example methods, apparatus and articles of manufacture have been described herein that reduce the settling time of signals through parallel transistors following switching events. Example techniques described herein prevent overcurrent and high temperature conditions on dies when parallel transistors are implemented by reducing the occurrence of voltage bounces and current discrepancies when the switching time of parallel transistors is not exactly synchronized. Example techniques described herein use a current averaging technique and/or follow-the-leader technique to actively drive a voltage onto a parallel feedback pin between parallel dies to reduce settling time of analog signals. Example apparatus, methods, and articles of manufacture described herein include fault monitoring systems on analog circuits to enable communication of faults between parallel dies and prevent cascading faults that may be caused by one parallel die overcompensating (e.g., taking on more current) due to a fault on a parallel die. Example apparatus, methods, and articles of manufacture described herein include a digital implementation of parallelized transistors that use two parallel feedback pins to enable intelligent PWM signal modulation, thereby improving synchronization of transistor switching and reducing current discrepancies between parallel dies. The described methods, apparatus and articles of manufacture improve the efficiency of using a computing device by enabling the safe and reliable usage of transistors in parallel on analog and digital circuits. The described methods, apparatus and articles of manufacture are accordingly directed to one or more improvement(s) in the functioning of a computing device.

Modifications are possible in the described embodiments, and other embodiments are possible, within the scope of the claims.

What is claimed is:

1. Apparatus comprising:
a first transistor on a first die, the first transistor including a first terminal, a second terminal and a control contact, the first terminal coupled to a voltage bus terminal, and the second terminal coupled to a switched terminal;
a second transistor on a second die, the second transistor including a third terminal and a fourth terminal, the third terminal coupled to the voltage bus terminal, and the fourth terminal coupled to the switched terminal;
a parallel feedback terminal coupled to the first die and the second die;
a current sensor including a first contact and a second contact, the first contact coupled to the first terminal of the first transistor, and the second contact coupled to the second terminal of the first transistor;
a resistor coupled to the current sensor and at least one of the switched terminal or a ground terminal;
an active drive controller including:
a first input coupled to the resistor;
a second input coupled to the parallel feedback terminal; and
an output coupled to the parallel feedback terminal; and
an edge delay controller adapted to be coupled to a gate driver and an error amplifier, and the control contact adapted to be coupled to the gate driver.

2. The apparatus of claim 1, wherein the resistor is a first resistor, and the apparatus further comprises a second resistor coupled between the parallel feedback terminal and at least one of the voltage bus terminal or the switched terminal.

3. The apparatus of claim 1, wherein the active drive controller includes an operational amplifier and a follow-the-leader switch.

4. The apparatus of claim 3, wherein the control contact is a first control contact, the follow-the-leader switch is a PFET, the PFET includes a second control contact, a fifth terminal and a sixth terminal, the output is coupled to the second control contact of the PFET, the fifth terminal of the PFET is coupled to the parallel feedback terminal, and the sixth terminal of the PFET is coupled to at least one of the switched terminal or the ground terminal.

5. The apparatus of claim 3, further comprising a bypass connection coupled between the parallel feedback terminal and the operational amplifier.

6. The apparatus of claim 5, wherein the bypass connection is coupled between the parallel feedback terminal and the operational amplifier in response to the active drive controller transitioning into an active drive mode.

7. The apparatus of claim 1, further comprising:
a first switched sampling resistor adapted to be coupled to the error amplifier; and
a second switched sampling resistor adapted to be coupled to the error amplifier.

8. The apparatus of claim 7, further comprising:
a first resistor switch coupled to the first switched sampling resistor and the parallel feedback terminal; and
a second resistor switch coupled to the second switched sampling resistor and the resistor.

9. A circuit comprising:
a first die including a first transistor, the first transistor including a first terminal, a second terminal and a control contact, the first terminal coupled to a voltage bus terminal, and the second terminal coupled to a switched terminal;
a second die including a second transistor, the second transistor including a third terminal and a fourth terminal, the third terminal coupled to the voltage bus terminal, and the fourth terminal coupled to the switched terminal;
a parallel feedback terminal coupled to the first die and the second die;
an indicator switch coupled to the parallel feedback terminal and at least one of the voltage bus terminal, the switched terminal or a ground terminal;
a fault indicator on the first die coupled to the indicator switch; and
a fault monitor on the second die coupled to the parallel feedback terminal, the fault monitor adapted to be coupled to a logic block.

10. The circuit of claim 9, wherein the indicator switch is at least one of an NFET or a PFET.

11. The circuit of claim 9, wherein the fault indicator is configured to detect a fault condition of the first die.

12. The circuit of claim 11, wherein the fault condition is at least one of an overcurrent condition, an undercurrent condition, an overtemperature condition, or an excess frequency condition.

13. The circuit of claim 11, wherein the indicator switch is configured to close in response to the fault indicator detecting a fault on the first die, the parallel feedback terminal coupled to a ground terminal when the indicator switch is closed.

14. The circuit of claim 11, wherein the second die further includes an edge delay controller adapted to be coupled to a gate driver and an error amplifier.

15. The circuit of claim 14, wherein the fault monitor is configured to disable the edge delay controller in response to the fault indicator detecting an excess frequency condition on the first die.

16. A method including:
generating a first voltage representative of a maximum current across a first transistor during a switching event;
adjusting a second voltage on a parallel feedback terminal coupled to a first die and a second die, in which the first die includes the first transistor, the second die includes a second transistor, the first die and the second die are coupled to a voltage bus terminal and a switched terminal, and the second voltage is adjusted based on a difference between the first voltage and the second voltage; and
adjusting a switching time of a pulse width modulated signal based on the difference between the first voltage and the second voltage.

17. The method of claim 16, wherein the second voltage is adjusted in response to a leader condition.

18. The method of claim 17, wherein the leader condition includes the first voltage being less than the second voltage.

19. The method of claim 16, wherein adjusting the second voltage includes closing a switch between a local circuit ground and the parallel feedback terminal.

20. The method of claim 19, wherein the switch is closed in response to a signal from a timing controller on the first die.

* * * * *